United States Patent
Akiba et al.

(10) Patent No.: US 9,312,197 B2
(45) Date of Patent: Apr. 12, 2016

(54) SUPPORT BASE-ATTACHED ENCAPSULANT, ENCAPSULATED SUBSTRATE HAVING SEMICONDUCTOR DEVICES MOUNTED THEREON, ENCAPSULATED WAFER HAVING SEMICONDUCTOR DEVICES FORMED THEREON, SEMICONDUCTOR APPARATUS, AND METHOD FOR MANUFACTURING SEMICONDUCTOR APPARATUS

(71) Applicant: SHIN-ETSU CHEMICAL CO., LTD., Tokyo (JP)

(72) Inventors: Hideki Akiba, Annaka (JP); Tomoaki Nakamura, Annaka (JP); Shinsuke Yamaguchi, Annaka (JP); Toshio Shiobara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/738,342

(22) Filed: Jun. 12, 2015

(65) Prior Publication Data

US 2016/0035638 A1 Feb. 4, 2016

(30) Foreign Application Priority Data

Jul. 31, 2014 (JP) ................. 2014-156155

(51) Int. Cl.
| | |
|---|---|
| H01L 23/29 | (2006.01) |
| B32B 27/28 | (2006.01) |
| B32B 27/38 | (2006.01) |
| B32B 27/12 | (2006.01) |
| H01L 21/56 | (2006.01) |
| H01L 21/78 | (2006.01) |
| H01L 23/31 | (2006.01) |

(52) U.S. Cl.
CPC .............. *H01L 23/296* (2013.01); *B32B 27/12* (2013.01); *B32B 27/283* (2013.01); *B32B 27/38* (2013.01); *H01L 21/561* (2013.01); *H01L 21/78* (2013.01); *H01L 23/3135* (2013.01); *B32B 2305/77* (2013.01); *B32B 2310/14* (2013.01); *B32B 2457/14* (2013.01)

(58) Field of Classification Search
CPC ..... H01L 23/296; H01L 21/78; H01L 21/561; B32B 27/12; B32B 27/38
USPC ........................................................ 257/788
See application file for complete search history.

(56) References Cited

U.S. PATENT DOCUMENTS

| 6,991,965 B2* | 1/2006 | Ono .................... H01L 23/3114 257/780 |
| 9,057,867 B2* | 6/2015 | Kumagai ................. C09D 4/06 |
| 2012/0161339 A1 | 6/2012 | Sekiguchi et al. |

FOREIGN PATENT DOCUMENTS

| JP | 2002179885 A | 6/2002 |
| JP | 2007001266 A | 1/2007 |

(Continued)

Primary Examiner — Luan C Thai
(74) Attorney, Agent, or Firm — Oliff PLC

(57) ABSTRACT

Support base-attached encapsulant for collectively encapsulating a semiconductor device mounting surface of a substrate or semiconductor device forming surface of a wafer, containing a support base having one fibrous film or a plurality of the fibrous films being laminated, the fibrous film subjected to surface treatment with an organosilicon compound, and a resin layer of thermosetting resin formed on one surface of the support base. The support base-attached encapsulant inhibit the substrate or wafer from warping and semiconductor devices from peeling away from the substrate, and collectively encapsulate the semiconductor device mounting surface of the substrate or the semiconductor device forming surface of the wafer even when a large-diameter wafer or large-area substrate is encapsulated. The support base-attached encapsulant has uniformity and homogeneity without opening or tangle of fiber, and is excellent in reliability such as heat resistance, electrical insulation property, moisture resistance, excellent in versatility, economical efficiency, and mass-productivity.

20 Claims, 2 Drawing Sheets

(56) References Cited

FOREIGN PATENT DOCUMENTS

| JP | 2009060146 A | 3/2009 |
| JP | 2012151451 A | 8/2012 |
| JP | 2013197327 A | 9/2013 |

* cited by examiner (A) Covering step (B) Encapsulating step (C) Piece forming step (D)

SUPPORT BASE-ATTACHED ENCAPSULANT, ENCAPSULATED SUBSTRATE HAVING SEMICONDUCTOR DEVICES MOUNTED THEREON, ENCAPSULATED WAFER HAVING SEMICONDUCTOR DEVICES FORMED THEREON, SEMICONDUCTOR APPARATUS, AND METHOD FOR MANUFACTURING SEMICONDUCTOR APPARATUS

BACKGROUND OF THE INVENTION

1. Field of the Invention

The present invention relates to a support base-attached encapsulant, an encapsulated substrate having semiconductor devices mounted thereon or an encapsulated wafer having semiconductor devices formed thereon using the encapsulant, a semiconductor apparatus manufactured from these, and a method for manufacturing the semiconductor apparatus.

2. Description of the Related Art

In the field of semiconductor apparatus production, various methods have been conventionally investigated about wafer-level encapsulation for a semiconductor device mounting surface of a substrate having semiconductor devices mounted thereon or a semiconductor device forming surface of a wafer having semiconductor devices formed thereon, and there may be exemplified by a method of encapsulating by spin coating or screen printing (Patent Document 1), and a method of using a complex sheet where a heat fusible epoxy resin has been coated on a film-form support (Patent Document 2 and Patent Document 3).

According to the methods mentioned above, encapsulation can be done without any big problems when a small-diameter wafer or a small-area substrate such as organic, inorganic, or metal substrate with a size of about 200 mm (8 inches) is used. However, when a large-area substrate or a large-diameter wafer of 300 mm (12 inches) or more is to be encapsulated, there is a problem that the substrate or the wafer occasionally warps due to shrinkage stress of the epoxy resin, etc., at the time of encapsulating and curing, and especially, the large-diameter wafer with thin thickness is liable to warp. In addition, when a semiconductor device mounting surface of a large-area substrate having semiconductor devices mounted thereon is encapsulated, the problem occurs that the semiconductor devices are peeled from the substrate by shrinkage stress of the epoxy resin, etc., at the time of encapsulating and curing. Accordingly, there is a big problem that encapsulated large-area substrates and large-diameter wafers cannot be used for mass-production.

To solve the problems brought by increasing the area of the substrate having semiconductor devices mounted thereon or the wafer having semiconductor devices formed thereon, methods of blending a filler with a content of about 90% by mass into a resin composition for use in encapsulating, or lowering elasticity of the encapsulating resin composition thereby reducing the shrinkage stress at the time of curing have been proposed (Patent Documents 1, 2, and 3).

However, there newly arises a problem that, when about 90% by mass of the filler is blended, viscosity of the encapsulating resin composition increases, and force is applied to the semiconductor devices mounted on the substrate at the time of casting, molding, and encapsulating the encapsulating resin composition, whereby the semiconductor devices are peeled from the substrate. Moreover, when elasticity of the encapsulating resin is lowered, although warp of the encapsulated substrate having semiconductor devices mounted thereon or the encapsulated wafer having semiconductor devices formed thereon can be improved, reduction in reliability such as heat resistance and moisture resistance newly occurs. Therefore, these solving methods cannot provide fundamental solutions for the problems of the encapsulation of a large-area substrate or a large-diameter wafer.

There is an attempt to encapsulate a large-diameter wafer or a large-area substrate such as organic, inorganic, or metal substrate by using a substrate-attached encapsulant in which a resin layer for use in encapsulating is formed on a substrate such as a fiber-containing substrate (Patent Documents 4 and 5). In the fiber-containing substrate, low expansion coefficient tends to be required, and therefore, a substrate obtained by impregnating a fiber such as glass fiber with an organic resin composition highly filled with an inorganic filler is adopted in many cases. However, there is a problem that since the organic resin composition has high viscosity, force is applied to the glass fiber thereby causing opening or tangle of fiber, and consequently, uniformity and homogeneity of the substrate are lowered, and the package warps due to the internal stress. Moreover, since the fiber-containing substrate is molded by high-temperature vacuum pressing or the like after impregnating with the organic resin composition, it is inferior in productivity. Further, if the fiber-containing substrate is made thick in order to reduce fiber-opening, tangle, warp, etc., the final product after packaging disadvantageously becomes a tall component.

Accordingly, there has been demanded an encapsulant that can collectively encapsulate a semiconductor device mounting surface of a substrate having the semiconductor devices mounted thereon or a semiconductor device forming surface of a wafer having semiconductor devices formed thereon on a wafer level without occurrence of warp of the substrate or the wafer and peeling of the semiconductor devices from the substrate such as inorganic, organic, or metal substrate even when a large-diameter wafer or a large-area substrate such as inorganic, organic, or metal substrate is encapsulated, and that has uniformity and homogeneity without opening or tangle of fiber even when a thin substrate is used, and that is excellent in reliability such as heat resistance, electrical insulation property, and moisture resistance after encapsulating, and further excellent in versatility, economical efficiency, and mass-productivity.

CITATION LIST

Patent Literature

[Patent Document 1] Japanese Patent Application Publication No. 2002-179885
[Patent Document 2] Japanese Patent Application Publication No. 2009-060146
[Patent Document 3] Japanese Patent Application Publication No. 2007-001266
[Patent Document 4] Japanese Patent Application Publication No. 2012-151451
[Patent Document 5] Japanese Patent Application Publication No. 2013-197327

SUMMARY OF THE INVENTION

The present invention has been accomplished to solve the above-described problems, and an object thereof is to provide a support base-attached encapsulant that can inhibit warp of the substrate or the wafer and peeling of the semiconductor devices from the substrate, and can collectively encapsulate a semiconductor device mounting surface of a substrate having the semiconductor devices mounted thereon or a semiconductor device forming surface of a wafer having semiconductor devices formed thereon even when a large-diameter wafer or a large-area substrate such as inorganic, organic, or metal substrate is encapsulated, and that has uniformity and homogeneity without opening or tangle of fiber even when a thin substrate is used, and that is excellent in reliability such as heat resistance, electrical insulation property, and moisture resistance after encapsulating, and extremely excellent in versatility, economical efficiency, and mass-productivity.

Another object of the present invention is to provide an encapsulated substrate having semiconductor devices mounted thereon and an encapsulated wafer having semiconductor devices formed thereon, each of which is encapsulated by the support base-attached encapsulant, and further provide a semiconductor apparatus obtained by dicing the encapsulated substrate having semiconductor devices mounted thereon or the encapsulated wafer having semiconductor devices formed thereon, and a method for manufacturing the semiconductor apparatus using the support base-attached encapsulant.

To achieve this object, the present invention provides a support base-attached encapsulant for collectively encapsulating a semiconductor device mounting surface of a substrate having semiconductor devices mounted thereon or a semiconductor device forming surface of a wafer having semiconductor devices formed thereon, comprising a support base having one fibrous film or a plurality of the fibrous films being laminated, the fibrous film being subjected to surface treatment with an organosilicon compound, and a resin layer composed of a thermosetting resin formed on one surface of the support base.

Such a support base-attached encapsulant can inhibit the substrate or the wafer from warping and the semiconductor devices from peeling from the substrate, and can collectively encapsulate the semiconductor device mounting surface of the substrate having the semiconductor devices mounted thereon or the semiconductor device forming surface of the wafer having semiconductor devices formed thereon even when a large-diameter wafer or a large-area substrate such as inorganic, organic, or metal substrate is encapsulated. Also, it has uniformity and homogeneity without opening or tangle of fiber since the fibrous film subjected to surface treatment, which is thinner than a fiber-impregnated substrate, is used therein. Further, the support base-attached encapsulant is excellent in reliability such as heat resistance, electrical insulation property, and moisture resistance after encapsulating, and extremely excellent in versatility, economical efficiency, and mass-productivity since the organosilicon compound is used for the surface treatment.

The fibrous film subjected to the surface treatment preferably has a conventional bending rigidity 3 to 100 times larger than a conventional bending rigidity of an untreated fibrous film as measured according to a procedure described in Japanese Industrial Standards R 3420.

Such a support base-attached encapsulant is further excellent in dimensional stability, electrical insulation property, heat resistance, weather resistance, and flexibility.

Further, an amount of the organosilicon compound used for the surface treatment is preferably 2% by mass or more and 90% by mass or less based on 100% by mass of the fibrous film subjected to the surface treatment, and a part or all of fiber bundles constituting the fibrous film are preferably bound by the surface treatment.

Such a support base-attached encapsulant is further excellent in heat resistance, electrical insulation property, dimensional stability, self-standing property, and flexibility.

Further, the organosilicon compound is preferably one or more compounds selected from the group consisting of alkoxysilane, polysilazane, partial hydrolysis condensates thereof, and a silicone-modified varnish.

Further, the fibrous film subjected to the surface treatment preferably does not have a glass transition temperature of 250° C. or less as measured according to a procedure described in Japanese Industrial Standards C 6481.

The support base-attached encapsulant using such a surface-treated fibrous film has more preferable heat resistance and electrical insulation property.

Further, a surface of the support base is preferably subjected to plasma treatment or corona treatment.

Such a support base-attached encapsulant can improve wetting property, bonding property, and adhesiveness between the support base and the resin layer.

Further, the thermosetting resin is preferably a resin selected from the group consisting of an epoxy resin, a silicone resin, a cyanate ester resin, and a hybrid resin thereof, and the resin layer is preferably uncured.

The support base-attached encapsulant having the resin layer composed of such a thermosetting resin exhibits excellent encapsulating performance such as heat resistance and moisture resistance after encapsulating.

Also, the present invention provides an encapsulated substrate having semiconductor devices mounted thereon, obtained by covering a semiconductor device mounting surface of a substrate having semiconductor devices mounted thereon with the resin layer of the above-described support base-attached encapsulant, and heating and curing the resin layer to collectively encapsulate the semiconductor device mounting surface by the support base-attached encapsulant.

In such an encapsulated substrate having semiconductor devices mounted thereon, occurrence of warp of the substrate and peeling of the semiconductor devices from the substrate are inhibited.

Also, the present invention provides an encapsulated wafer having semiconductor devices formed thereon, obtained by covering a semiconductor device forming surface of a wafer having semiconductor devices formed thereon with the resin layer of the above-described support base-attached encapsulant, and heating and curing the resin layer to collectively encapsulate the semiconductor device forming surface by the support base-attached encapsulant.

In such an encapsulated wafer having semiconductor devices formed thereon, occurrence of warp of the wafer or the substrate is inhibited.

Also, the present invention provides a semiconductor apparatus obtained by dicing the encapsulated substrate having semiconductor devices mounted thereon or the encapsulated wafer having semiconductor devices formed thereon into each piece.

Such a semiconductor apparatus is high quality since the semiconductor apparatus is manufactured from the substrate or the wafer that is encapsulated by the support base-attached encapsulant excellent in encapsulating performance such as heat resistance and moisture resistance and the substrate or the wafer is inhibited from warping.

Also, the present invention provides a method for manufacturing a semiconductor apparatus, comprising:

a covering step of covering a semiconductor device mounting surface of a substrate having semiconductor devices mounted thereon, or a semiconductor device forming surface of a wafer having semiconductor devices formed thereon with the resin layer of the above-described support base-attached encapsulant;

an encapsulating step of collectively encapsulating the semiconductor device mounting surface of the substrate or the semiconductor device forming surface of the wafer by heating and curing the resin layer to provide an encapsulated substrate having semiconductor devices mounted thereon or an encapsulated wafer having semiconductor devices formed thereon; and a piece forming step of dicing the encapsulated substrate having semiconductor devices mounted thereon or the encapsulated wafer having semiconductor devices formed thereon into each piece to manufacture a semiconductor apparatus.

According to such a method for manufacturing a semiconductor apparatus, the semiconductor device mounting surface or the semiconductor device forming surface can be covered more readily without a filling failure, and the encapsulated substrate having semiconductor devices mounted thereon or the encapsulated wafer having semiconductor devices formed thereon, in which warp of the substrate or the wafer and peeling of the semiconductor devices from the substrate are inhibited, can be obtained even when a thin large-diameter wafer or a large-area substrate made of a metal or the like is collectively encapsulated. Further, by dicing the substrate or the wafer thus obtained into each piece, a high-quality semiconductor apparatus excellent in encapsulating performance such as heat resistance and moisture resistance can be manufactured.

As described above, according to the inventive support base-attached encapsulant having a resin layer composed of a thermosetting resin formed on one surface of the support base, since the shrinkage stress of the resin layer at the time of curing the encapsulant can be suppressed, warp of the substrate or the wafer and peeling of the semiconductor devices from the substrate can be inhibited even when a large-diameter wafer or a large-area substrate is encapsulated, and the semiconductor device mounting surface of the substrate having semiconductor devices mounted thereon or the semiconductor device forming surface of the wafer having semiconductor devices formed thereon can be collectively encapsulated. Also, the inventive support base-attached encapsulant has uniformity and homogeneity without opening or tangle of fiber since the surface-treated fibrous film, which is thinner than the fiber-impregnated substrate, is used therein. Further, after encapsulating, this encapsulant exhibits excellent reliability such as heat resistance, electrical insulation property, light resistance, and moisture resistance due to the characteristics of the silicone resin, etc., derived from the resin layer or the organosilicon compound used in the surface treatment, and exhibits extremely excellent versatility, mass-productivity such as dimensional stability and printability, productivity, and economical efficiency.

Moreover, in the encapsulated substrate having semiconductor devices mounted thereon and the encapsulated wafer having semiconductor devices formed thereon, which have been encapsulated by the support base-attached encapsulant, warp of the substrate or the wafer and peeling of the semiconductor devices from the substrate such as inorganic, organic, or metal substrate are inhibited. Further, the semiconductor apparatus obtained by dicing into each piece the encapsulated substrate having semiconductor devices mounted thereon or the encapsulated wafer having semiconductor devices formed thereon, which has been encapsulated with the support base-attached encapsulant excellent in reliability such as heat resistance, electrical insulation property, light resistance, and moisture resistance and is inhibited from warping, is high quality.

DETAILED DESCRIPTION OF THE PREFERRED EMBODIMENTS

Figure 1:
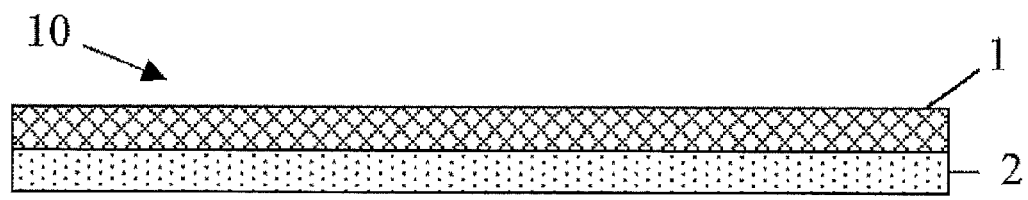
FIG. 1 shows an exemplary cross-sectional view of the support base-attached encapsulant of the present invention.

In the following, the support base-attached encapsulant and the method for manufacturing the same, the encapsulated substrate having semiconductor devices mounted thereon and the encapsulated wafer having semiconductor devices formed thereon that are each obtained by being encapsulated with the support base-attached encapsulant, the semiconductor apparatus obtained by dicing the encapsulated substrate having semiconductor devices mounted thereon or the encapsulated wafer having semiconductor devices formed thereon into each piece, and the method for manufacturing the semiconductor apparatus using the support base-attached encapsulant of the present invention will be described in detail, but the present invention is not limited thereto.

As described above, there has been demanded a highly versatile encapsulant that can inhibit warp of the substrate or the wafer and peeling of the semiconductor devices from the substrate made of a metal or so on, can collectively encapsulate the semiconductor device mounting surface of the substrate having the semiconductor devices mounted thereon or the semiconductor device forming surface of the wafer having semiconductor devices formed thereon even when a large-area substrate having semiconductor devices mounted thereon, such as inorganic, organic, or metal substrate, or a large-diameter wafer having semiconductor devices formed thereon is encapsulated, has uniformity and homogeneity without opening or tangle of fiber even when a thin substrate is used, and is excellent in reliability such as heat resistance and moisture resistance after encapsulating.

The present inventors diligently study to accomplish the above-described objects and consequently found that when a support base-attached encapsulant has a support base containing a fibrous film subjected to surface treatment with an organosilicon compound and has a resin layer composed of a thermosetting resin formed on one surface of the support base, the support base-attached encapsulant has uniformity and homogeneity without opening or tangle of fiber even when a thin substrate is used, and a difference in expansion coefficient between the substrate or the wafer and the support base is small, and shrinkage stress of the resin layer at the time of curing can be thus suppressed, thereby enabling reduction in warp of the substrate or the wafer.

By the effect of suppressing the shrinkage stress, they found that even when a large-diameter wafer or a large-area substrate such as inorganic, organic, and metal substrate is encapsulated, warp of the substrate or the wafer and peeling of the semiconductor devices from the substrate can be inhibited. Further, they found that when the support base-attached encapsulant of the present invention is used, the semiconductor device mounting surface of the substrate having semiconductor devices mounted thereon or the semiconductor device forming surface of the wafer having semiconductor devices formed thereon can be collectively encapsulated, and after encapsulating, it exhibits excellent reliability such as heat resistance, electrical insulation property, light resistance, and moisture resistance, and extremely excellent versatility, mass-productivity such as dimensional stability and printability, and economical efficiency. Therefore, they brought the support base-attached encapsulant of the present invention to completion.

Also, the present inventors found that in the encapsulated substrate having semiconductor devices mounted thereon and the encapsulated wafer having semiconductor devices formed thereon each obtained by being collectively encapsulated with the above-described support base-attached encapsulant, warp of the substrate or the wafer and peeling of the semiconductor devices from the substrate can be inhibited. Further, they found that a high-quality semiconductor apparatus can be obtained by dicing into each piece such an encapsulated substrate having semiconductor devices mounted thereon or an encapsulated wafer having semiconductor devices formed thereon, which are inhibited from warping and peeling of the semiconductor devices, thereby bringing the encapsulated substrate having semiconductor devices mounted thereon, the encapsulated wafer having semiconductor devices formed thereon, and the semiconductor apparatus of the present invention to completion.

Further, the present inventors found that using the above-described support base-attached encapsulant enables easily covering the semiconductor device mounting surface or the semiconductor device forming surface, and further found that the semiconductor device mounting surface or the semiconductor device forming surface can be collectively encapsulated by heating and curing the resin layer of the support base-attached encapsulant. Further, they found that a high-quality semiconductor apparatus can be manufactured by dicing into each piece the encapsulated substrate having semiconductor devices mounted thereon or the encapsulated wafer having semiconductor devices formed thereon, which has been encapsulated with the support base-attached encapsulant excellent in reliability such as heat resistance, electrical insulation property, light resistance, and moisture resistance and configured to inhibit warp and peeling of the semiconductor devices, thereby bringing the method for manufacturing a semiconductor apparatus of the present invention to completion.

That is, the present invention is a support base-attached encapsulant for collectively encapsulating a semiconductor device mounting surface of a substrate having semiconductor devices mounted thereon or a semiconductor device forming surface of a wafer having semiconductor devices formed thereon, comprising a support base having one fibrous film or a plurality of the fibrous films being laminated, the fibrous film being subjected to surface treatment with an organosilicon compound, and a resin layer composed of a thermosetting resin formed on one surface of the support base.

Hereinafter, the support base and the resin layer of the support base-attached encapsulant of the present invention will be described.

<Support Base>

The support base used in the present invention is a surface-treated fibrous film, which is a fibrous film a surface of which is treated with an organic compound containing silicon atoms (hereinafter, referred to as an organosilicon compound). On one surface of the support base, a resin layer composed of a thermosetting resin which corresponds to an encapsulant is provided.

The surface-treated fibrous film used in the support base is a film subjected to surface treatment with an organosilicon compound and preferably has a conventional bending rigidity 3 to 100 times larger than a conventional bending rigidity of an untreated fibrous film as measured according to a procedure described in Japanese Industrial Standards (JIS) R 3420.

The value of the conventional bending rigidity is measured according to a procedure described in JIS R 3420. Multiples of the conventional bending rigidity of the untreated fibrous film is used as an index showing degree of change from so-called "woven fabric" form to "film" form by subjecting one fibrous film to surface treatment, and it is preferably 5 to 60 times, more preferably 10 to 50 times.

If it is 3 times or more, the objective dimensional stability and fiber fixation, i.e. the effect of preventing twist, opening, and tangle can be achieved, and sufficient electrical insulation property, heat resistance, and weather resistance due to the siloxane characteristics are provided. Moreover, if it is 100 times or less, cracks are not generated since the bending rigidity is not too hard, and deterioration of workability, mass-productivity, profitability, and economical efficiency can be prevented since flexibility is not reduced.

For making properties including electrical insulation property, heat resistance, weather resistance, dimensional stability, and flexibility more preferable, the amount of the organosilicon compound to be adhered onto the fibrous film is preferably 2 to 90% by mass, more preferably 5 to 70% by mass, much more preferably 10 to 60% by mass based on 100% by mass of the fibrous film after surface treatment.

If the adhesion amount is 2% by mass or more, dimensional stability and fiber fixation, i.e. the effect of preventing twist, opening, and tangle can be sufficiently obtained. Also, the shrinkage stress at the time of curing a later-described resin layer can be suppressed, and when a large-diameter wafer or a large-area substrate such as inorganic, organic, or metal substrate is encapsulated with the support base-attached encapsulant of the present invention, the effects of inhibiting warp of the substrate or the wafer and inhibiting peeling of the semiconductor devices from the substrate can be sufficiently obtained. Further, electrical insulation property, heat resistance, and weather resistance due to the siloxane characteristics become preferable.

Also, when it is 90% by mass or less, the surface-treated fibrous film is not too hard, and therefore no crack are generated and sufficient flexibility can be obtained. Thus, workability, mass-productivity, profitability, and economical efficiency become preferable. Further, such a material is suitable for the support base since there is no possibility the substrate becomes too thick.

Examples of the fibrous film used in the present invention include a glass fiber film. In the case that the glass fiber film is used, it may be subjected to fiber-opening processing with column-like flow or water flow caused by a high-frequency vibration method. Further, in the present invention, any glass fiber made of E-glass, A-glass, D-glass, S-glass, or so on can be used. The E-glass is preferable in view of cost and availability. If higher properties (such as low permittivity, high heat resistance, and low impurity) are required, quartz glass is preferable.

Also, the glass fiber film preferably has a weaving density of the fiber of 10 to 200 yarns/25 mm, more preferably 15 to 100 yarns/25 mm, and preferably has a mass of 5 to 400 g/m$^2$, more preferably 10 to 300 g/m$^2$. Such ranges enable the above-described effect to be easily obtained when the glass fiber film is subjected to surface treatment.

The weaving method is not particularly limited, and plain weave, satin weave, twill weave, basket weave, etc., may be used. The film may be prepared by weaving two glass fibers both or one of which is textured. A 3-spindle braided glass fiber can be a surface-treated fibrous film having higher strength and reliability. In addition, a non-woven fabric or fabrics in which long fibers are arrayed along a certain direction can also be used.

When performing the surface treatment with the organosilicon compound, in the case that a bundling agent is applied to the glass fiber, it is preferred that the agent be previously removed since it occasionally disturbs the surface treatment with the organosilicon compound.

In the present invention, the fibrous film is not limited to the above-described glass fiber, and fabrics using fibers such as inorganic fibers e.g. carbon fiber and ceramics-based fiber; metal fibers e.g. boron fiber, steel fiber, and tungsten fiber; novel heat-resistant fibers e.g. aramid-based fiber and phenolic-based fiber, can also be used.

Examples of the organosilicon compound used for the surface treatment of the fibrous film to obtain the surface-treated fibrous film used in the present invention include one or more compounds selected from the group consisting of alkoxysilane, polysilazane, partial hydrolysis condensates thereof, and a silicone-modified varnish.

Examples of the alkoxysilane include tetraalkoxysilanes such as tetramethoxysilane and tetraethoxysilane; alkylalkoxysilanes such as trimethylmethoxysilane, trimethylethoxysilane, dimethyldimethoxysilane, dimethyldiethoxysilane, methyltrimethoxysilane, methyltriethoxysilane, n-propyltriethoxysilane, hexyltrimethoxysilane, octyltriethoxysilane, decyltrimethoxysilane, and 1,6-bis(trimethoxysilyl)hexane; arylalkoxysilanes such as methylphenyldimethoxysilane, methylphenyldiethoxysilane, diphenyldimethoxysilane, diphenyldiethoxysilane, phenyltrimethoxysilane, phenyltriethoxysilane, p-styryltrimethoxysilane; hydroxyalkoxysilanes such as hydroxytrimethoxysilane and hydroxytriethoxysilane; alkenylalkoxysilanes such as vinyltrimethoxysilane and vinyltriethoxysilane; epoxy group-containing alkoxysilanes, such as 3-glycidoxypropyltrimethoxysilane, 3-glycidoxypropylmethyldimethoxysilane, 3-glycidoxypropyl-triethoxysilane, 3-glycidoxypropylmethyldiethoxysilane, and 2-(3,4-epoxycyclohexyl)ethyltrimethoxysilane; (meth)acrylic group-containing alkoxysilanes, such as 3-methacryloxypropyltrimethoxysilane, 3-methacryloxypropylmethyldimethoxysilane, 3-methacryloxypropyltriethoxysilane, 3-methacryloxypropylmethyldiethoxy silane, and 3-acryloxypropyltrimethoxysilane; amino group-containing alkoxysilanes such as N-2-(aminoethyl)3-aminopropyltrimethoxysilane, N-2-(aminoethyl)3-aminopropylmethyldimethoxysilane, 3-aminopropyltrimethoxysilane, 3-aminopropyltriethoxysilane, N-phenyl-3-aminopropyltrimethoxysilane, 3-allylaminopropyltrimethoxysilane, N—(N-vinylbenzyl)-2-aminoethyl-3-aminopropyltrimethoxysilane and hydrochloride thereof, N—(N-vinylbenzyl)-2-aminoethyl-3-aminopropylmethyldimethoxysilane and hydrochloride thereof; isocyanate alkoxysilanes such as 3-isocyanate propyltriethoxysilane and tris-(trimethoxysilylpropyl)-isocyanurate; and alkoxysilane compounds such as 3-ureidopropyltriethoxysilane, 3-chloropropyltrimethoxy-silane, 3-mercaptopropyltrimethoxysilane, 3-mercaptopropylmethyldimethoxysilane, and bis(trisethoxysilylpropyl)tetrasulfide. These alkoxysilanes may be used alone or in combination of two or more kinds. Also, it is not limited thereto.

Examples of the polysilazane include compounds such as 1,1,3,3-tetramethyldisilazane, hexamethyldisilazane, 1,3-divinyl-1,1,3,3-tetramethyldisilazane, 1,1,3,3,5,5-hexamethylcyclotrisilazane, but it is not limited thereto.

As the silicone-modified varnish, various silicone-modified varnishes such as alkyd-modified varnish, polyester-modified varnish, epoxy-modified varnish, and acrylic-modified varnish may be used, and it may be appropriately selected depending on the final use and the purpose.

Preferable examples of the organosilicon compound are alkoxysilanes. Among them, preferable alkoxysilanes are methyltrimethoxysilane and alkoxysilanes having a functional group, and selected from type generally designated as a silane coupling agent. For example, it may be exemplified by silane coupling agents such as vinyltrimethoxysilane, 3-glycidoxypropyltrimethoxysilane, and 3-aminopropyltrimethoxysilane.

Furthermore, partial hydrolysis condensates of alkoxysilane are also preferable as the organosilicon compound. In particular, alkoxysilane oligomer having both a functional group obtained by partial hydrolysis condensation of the silane coupling agent mentioned above and an alkoxysilyl group are preferable as the organosilicon compound. Specifically, epoxy group-containing alkoxysilane oligomer X-41-1059A (available from Shin-Etsu Chemical Co., Ltd.), amino group-containing alkoxysilane oligomer X-40-2651 (available from Shin-Etsu Chemical Co., Ltd.) and the like are preferable.

A linear expansion coefficient in an X-Y direction of the surface-treated fibrous film used in the present invention is preferably 0.5 to 25 ppm/° C., and more preferably 1 to 20 ppm/° C. An exemplary method for measuring the linear expansion coefficient in the X-Y direction includes cutting a sample with a width of 3 mm, a length of 25 mm, and a thickness of 50 to 300 μm, and measuring via a tensile test in the temperature range of from −60° C. to 200° C. with a temperature raising rate of 5° C./min by using a thermomechanical analysis (TMA) apparatus.

If the linear expansion coefficient is a low value of 25 ppm/° C. or less, thermal impact resistance is high, and even when a large-diameter wafer or a large-area substrate is encapsulated, warp of the substrate or the wafer and peeling of the semiconductor devices from the substrate can be inhibited, thereby being capable of responding to high demand for miniaturization, etc. It is to be noted that the X-Y direction means a plane direction of the support base to be prepared. Additionally, the linear expansion coefficient in the X-Y direction means an expansion coefficient measured while arbitrarily setting an X axis and a Y axis in the plane direction of the support base.

Generally, the substrate having semiconductor devices mounted thereon and the support base preferably have similar physical characteristics. In particular, it is preferred that both substrates have substantially the same expansion coefficient, or both substrates have small difference in expansion coefficient of 25 ppm/° C. or less, more preferably 20 ppm/° C. or less. If the both substrates have the similar physical characteristics, the occurrence of warp of the semiconductor apparatus after encapsulating with the resin layer composed of the thermosetting resin can be further inhibited.

The surface-treated fibrous film used in the present invention preferably does not have a glass transition temperature of 250° C. or less, more preferably does not have a glass transition temperature of 300° C. or less, as measured according to a procedure described in JIS C 6481. If it does not have a glass transition temperature of 250° C. or less, the obtained substrate is excellent in heat resistance, electrical insulation property, and flexibility, and is inhibited from warping at high temperature, thereby being capable of responding to high demand for miniaturization, etc.

As a method of producing the surface-treated fibrous film used in the present invention, common methods of processing a glass fiber can be applied.

Among them, as a method of applying the organosilicon compound onto the fibrous film, common methods of applying to a glass fiber (coating method) can be applied. Typical examples of the coating method include a direct gravure coater, a chamber doctor coater, an offset gravure coater, a single-roll-kiss coater, a reverse kiss coater, a bar coater, a reverse roll coater, a slot die, an air doctor coater, a normal rotation roll coater, a blade coater, a knife coater, a dip coater, an MB coater, and an MB reverse coater. Among these, a direct gravure coater, an offset coater, and a dip coater coating method are preferred for manufacturing the support base, and particularly the surface-treated fibrous film in the present invention.

Although the conditions are depending on the organosilicon compound to be used, examples of the conditions are, after applying, heating while rising the temperature from room temperature to 300° C. for 1 minute to 24 hours for the purpose of drying and curing. In view of productivity, cost, and workability, the surface-treated fibrous film is preferably manufactured by heat treatment while rising the temperature from room temperature to 250° C. for 3 minutes to 4 hours, more preferably from room temperature to 230° C. for 5 minutes to 1 hour.

Herein, the room temperature means 25° C.±10° C.

The coating solution used in the above-described applying method is a solution in which the organosilicon compound is diluted with a solvent. Examples of the solvent include water and an organic solvent, and these may be used alone or in combination of two or more kinds. Examples of the organic solvent include alcohols such as methanol, ethanol, isopropanol, and n-butanol; ketones such as acetone, methyl ethyl ketone, and methyl isobutyl ketone; glycol ethers such as ethylene glycol and propylene glycol; aliphatic hydrocarbons such as hexane and heptane; aromatic hydrocarbons such as toluene and xylene; and ethers such as diethyl ether, diisopropyl ether, and di-n-butyl ether. It is also possible to further add an organic acid such as formic acid, acetic acid, propionic acid, and oxalic acid; a pH adjusting agent such as aqueous ammonia; a pigment, a filler, a surfactant, a thickener, etc., to the diluted solution.

In addition, an alkoxy group condensation catalyst may also be added, and examples thereof include an organometallic compound catalyst such as an organotin compound, an organotitanium compound, and an organobismuth compound; and an amine compound.

The organometallic compound condensation catalyst may be exemplified by metallic Lewis acids. Illustrative examples thereof include organotin compounds such as dibutyltin dimethoxide, dibutyltin diacetate, dibutyltin dioctoate, dibutyltin dilaurate, dibutyltin bis(acetyl-acetonato), dibutyltin bis(benzylmaleate), dimethyltin dimethoxide, dimethyltin diacetate, dioctyltin dioctoate, dioctyltin dilaurate, tin dioctoate, and tin dilaurate; organotitanium compounds such as tetraisopropyl titanate, tetra-normal-butyl titanate, tetra-tertiary-butyl titanate, tetra-normal-propyl titanate, tetra-2-ethylhexyl titanate, diisopropyl-di-tertiary-butyl titanate, dimethoxytitanium bisacetylacetonato, diisopropoxytitanium bisethylacetoacetate, di-tertiary-butoxytitanium bisethylacetoacetate, and di-tertiary-butoxytitanium bismethylacetoacetate; and organobismuth compounds such as bismuth tris(2-ethylhexanoate) and bismuth tris(neodecanoate). These may be used alone or in combination of two or more kinds.

Illustrative examples of the amine compound include hexylamine, di-2-ethylhexylamine, N,N-dimethyldodecylamine, di-n-hexylamine, dicyclohexylamine, di-n-octylamine, and hexamethoxymethylmelamine.

Among these condensation catalysts, organotitanium compounds are particularly preferable.

The coating solution is preferably an aqueous type coating solution in view of effect on the coating environment. An amino group-containing silane coupling agent (Product name: KBM-903, available from Shin-Etsu Chemical Co., Ltd.) is excellent in stability in an aqueous system and has good solubility, so that it is preferable as the organosilicon compound.

In the present invention, a sheet of the above-described surface-treated fibrous film or a plurality of the surface-treated fibrous film being laminated is used as the base to manufacture the support base.

The fiber-impregnated substrate conventionally used as the base is manufactured by impregnating glass fibers with a resin composition that is highly filled with an inorganic filler, and molding it by high-temperature vacuum pressing into semi-cured or cured form, so that the glass fibers in the substrate are opened, and tangle, twist, and so on are generated. This causes internal stress at the time of encapsulating, and disadvantageously results in warp of the substrate or the wafer and delamination between the substrate and the semiconductor devices after encapsulating.

In the present invention, since the above-described surface-treated fibrous film is used, the support base is thin and has uniformity and homogeneity without opening, twist, or tangle of fiber, and thus internal stress. Also, it is excellent in encapsulating performance such as electrical insulation property, heat resistance, and light resistance due to the siloxane characteristics derived from the organosilicon compound. Further, since the molding by high-temperature vacuum pressing is unnecessary, the support base can be simply manufactured, and thus the support base-attached encapsulant can be continuously produced, and is excellent in productivity, mass-productivity, and economical efficiency.

<Resin Layer>

The support base-attached encapsulant of the present invention has a resin layer composed of a thermosetting resin. The resin layer is composed of a thermosetting resin formed on one surface of the above-described support base. The resin layer can be used as an encapsulant for encapsulating semiconductor devices.

The thickness of the resin layer is preferably in the range of 20 μm to 5000 μm. The thickness of the resin layer depends on the thickness of the semiconductor devices, and may be a sufficient amount to encapsulate the semiconductor device mounting surface of the substrate having semiconductor devices mounted thereon or the semiconductor device forming surface of the wafer having semiconductor devices formed thereon. The thickness of 20 μm or more is preferable since the occurrence of a failure in filling due to being too thin can be inhibited. When the thickness is 5000 μm or less, an encapsulated substrate having semiconductor devices mounted thereon and an encapsulated wafer having semiconductor devices formed thereon can be inhibited from becoming thicker than required, therefore a semiconductor apparatus with high reliability can be obtained.

The thermosetting resin is not particularly limited, but preferably is an uncured thermosetting resin composed of a solid epoxy resin, a liquid epoxy resin, a silicone resin, a hybrid resin of an epoxy resin and a silicone resin, or a cyanate ester resin each of which is generally used for encapsulating semiconductor devices. In particular, the resin layer preferably contains any of an epoxy resin, a silicone resin, an epoxy-silicone hybrid resin, and a cyanate ester resin each of which solidifies at temperatures lower than 50° C. and melts at temperatures ranging from 50° C. to 150° C.

[Epoxy Resin]

The epoxy resin may be for example, but not particularly limited to, a biphenol type epoxy resin such as a bisphenol A type epoxy resin, a bisphenol F type epoxy resin, a 3,3',5,5'-tetramethyl-4,4'-biphenol type epoxy resin, and a 4,4'-biphenol type epoxy resin; an epoxy resin in which an aromatic ring of a phenol novolac type epoxy resin, a cresol novolac type epoxy resin, a bisphenol A novolac type epoxy resin, a naphthalenediol type epoxy resin, a trisphenylolmethane type epoxy resin, a tetrakisphenylolethane type epoxy resin, or a phenoldicyclopentadiene novolac type epoxy resin has been hydrogenated; and a known epoxy resin which is a liquid state or a solid state at room temperature such as an alicyclic epoxy resin, etc. An epoxy resin(s) other than the above may be used in combination with a certain amount depending on the purposes of the present invention.

Since the resin layer composed of an epoxy resin becomes a resin layer for encapsulating semiconductor devices, the amount of halogen ions such as chlorine and alkali ions such as sodium, contained therein, is preferably reduced as possible. An exemplary method of reducing these ions includes adding 10 g of a sample into 50 ml of ion exchanged water, sealing the mixture, leaving the mixture standing still in an oven at 120° C. for 20 hours, and then extracting the resultant sample under heating; it is then desired that all the ions in the sample extracted at 120° C. are 10 ppm or less.

In the resin layer composed of an epoxy resin, a curing agent for the epoxy resin may be contained. Examples of a usable curing agent include a phenol novolac resin, various kinds of amine derivatives, an acid anhydride, and those in which an acid anhydride group is partially ring-opened to form a carboxylic acid. Above all, a phenol novolac resin is desired to ensure the reliability of a semiconductor apparatus to be manufactured by using the support base-attached encapsulant of the present invention. It is particularly preferred that an epoxy resin and a phenol novolac resin be mixed such that the ratio of the epoxy group to the phenolic hydroxyl group is 1:0.8 to 1:1.3.

In addition, imidazole derivatives, phosphine derivatives, amine derivatives, a metal compound such as an organic aluminum compound, etc., may be used as a reaction promoter to promote the reaction of the epoxy resin and the curing agent.

The resin layer composed of an epoxy resin may further contain various kinds of additives, if necessary. For example, for the purpose of improving the properties of the resin, various kinds of thermoplastic resins, thermoplastic elastomers, organic synthetic rubbers, stress lowering agents of silicone type or other type, waxes, and additives such as a halogen-trapping agent, etc., may be added depending on the purpose of the present invention.

[Silicone Resin]

As to the silicone resin, a thermosetting silicone resin, etc., are usable. In particular, the resin layer composed of a silicone resin desirably contains an addition curable silicone resin composition. The addition curable silicone resin composition particularly preferred is a composition including (A) an organosilicon compound having a nonconjugated double bond, (B) an organohydrogenpolysiloxane, and (C) a platinum-based catalyst as components. These components of (A) to (C) will be described below.

Component (A): Organosilicon Compound Having Nonconjugated Double Bond

Examples of the component (A) include an organopolysiloxane represented by the general formula (1):

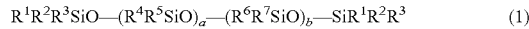

(1)

wherein $R^1$ represents a monovalent hydrocarbon group containing a nonconjugated double bond, $R^2$ to $R^7$ each represent an identical or different monovalent hydrocarbon group, and "a" and "b" are each an integer satisfying $0 \leq a \leq 500$, $0 \leq b \leq 250$, and $0 \leq a+b \leq 500$.

In the general formula (1), $R^1$ is a monovalent hydrocarbon group containing a nonconjugated double bond, and preferably a monovalent hydrocarbon group containing a nonconjugated double bond having an aliphatic unsaturated bond as typified by an alkenyl group preferably having 2 to 8 carbon atoms, particularly preferably 2 to 6 carbon atoms.

In the general formula (1), $R^2$ to $R^7$ are each an identical or different monovalent hydrocarbon group; examples thereof include an alkyl group, an alkenyl group, an aryl group, and an aralkyl group each preferably having 1 to 20 carbon atoms, particularly preferably 1 to 10 carbon atoms. Among these, more preferable examples of $R^4$ to $R^7$ include a monovalent hydrocarbon group except for an aliphatic unsaturated bond; particularly preferable example thereof include an alkyl group, an aryl group, or aralkyl group, which do not have an aliphatic unsaturated bond unlike an alkenyl group. Among these, $R^6$ and $R^7$ are preferably an aromatic monovalent hydrocarbon group, particularly preferably an aryl group having 6 to 12 carbon atoms, such as a phenyl group and a tolyl group.

In the general formula (1), "a" and "b" are each preferably an integer satisfying $0 \leq a \leq 500$, $0 \leq b \leq 250$, and $0 \leq a+b \leq 500$; "a" is more preferably $10 \leq a \leq 500$; "b" is more preferably $0 \leq b \leq 150$; and a+b more preferably satisfies $10 \leq a+b \leq 500$.

The organopolysiloxane represented by the general formula (1) can be obtained, for example, by an alkali equilibration reaction between a cyclic diorgano-polysiloxane such as cyclic diphenylpolysiloxane or cyclic methylphenylpolysiloxane and a disiloxane such as diphenyltetravinyldisiloxane or divinyltetraphenyl-disiloxane to constitute a terminal group. In this case, since, in an equilibration reaction by an alkali catalyst (particularly a strong alkali such as KOH), polymerization proceeds with a small amount of the catalyst by an irreversible reaction; thereby a ring-opening polymerization alone proceeds quantitatively and a terminal blocking ratio becomes high. Therefore, a silanol group and a chlorine content are generally not contained.

The organopolysiloxane represented by the general formula (1) may be exemplified by the following,

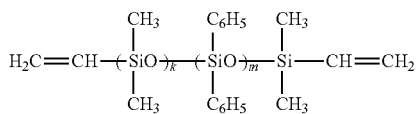

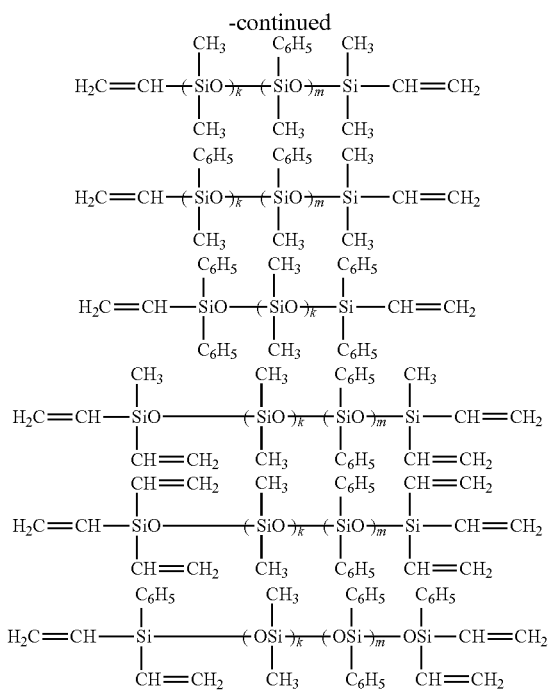

wherein "k" and "m" are each preferably an integer satisfying 0≤k≤500, 0≤m≤250, and 0≤k+m≤500, more preferably an integer satisfying 5≤k+m≤250 and 0≤m/(k+m)≤0.5.

The organopolysiloxane having a linear structure represented by the general formula (1) may be used as the component (A) in combination with an organopolysiloxane having a three-dimensional network structure including a trifunctional siloxane unit, a tetrafunctional siloxane unit, etc., if needed. The silicon compound having a nonconjugated double bond (A) may be used alone or in combination of two or more kinds.

The amount of the group having a nonconjugated double bond (the monovalent hydrocarbon group having a double bond and bonded to a Si atom) in the silicon compound having a nonconjugated double bond (A), is preferably 1 to 50 mol % of the total amount of the monovalent hydrocarbon group (the total amount of the monovalent hydrocarbon group bonded to a Si atom), more preferably 2 to 40 mol %, particularly preferably 5 to 30 mol %. The reason why these amounts are preferable is that if the amount of the group having a nonconjugated double bond is 1 mol % or more, a good cured product can be obtained when it is cured, and if it is 50 mol % or less, the mechanical properties of a cured product become good.

In addition, the silicon compound having a nonconjugated double bond (A) preferably contains an aromatic monovalent hydrocarbon group (an aromatic monovalent hydrocarbon group bonded to a Si atom); the content of the aromatic monovalent hydrocarbon group is preferably 0 to 95 mol % of the total amount of the monovalent hydrocarbon group (the total amount of the monovalent hydrocarbon group bonded to a Si atom), more preferably 10 to 90 mol %, particularly preferably 20 to 80 mol %. When the aromatic monovalent hydrocarbon group is contained in the resin with a suitable amount, there are merits that mechanical properties when it is cured are good and producing thereof is easy.

Component (B): Organohydrogenpolysiloxane

The component (B) is preferably an organohydrogenpolysiloxane having two or more hydrogen atoms bonded to silicon atoms (SiH group) per molecule. The organohydrogenpolysiloxane having two or more hydrogen atoms bonded to silicon atoms (SiH group) per molecule functions as a crosslinker and enables the formation of a cured product by addition reaction between the SiH group in component (B) and the group having a nonconjugated double bond, such as a vinyl group or an alkenyl group, in component (A).

The organohydrogenpolysiloxane, component (B), preferably has an aromatic monovalent hydrocarbon group. If the organohydrogenpolysiloxane (B) has an aromatic monovalent hydrocarbon group, compatibility with the component (A) can be increased. The organohydrogenpolysiloxane (B) may be used alone or in combination of two or more kinds. For example, the organohydrogenpolysiloxane having an aromatic hydrocarbon group may be contained as a part of the component (B) or used as the component (B).

Examples of the component (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-glycidoxypropyl-1,3,5,7-tetramethylcyclotetrasiloxane, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, methylhydrogenpolysiloxane having both molecular terminals blocked with trimethylsiloxy groups, a dimethylsiloxane/methylhydrogensiloxane copolymer having both molecular terminals blocked with trimethylsiloxy groups, dimethylpolysiloxane having both molecular terminals blocked with dimethylhydrogensiloxy groups, a dimethylsiloxane/methylhydrogensiloxane copolymer having both molecular terminals blocked with dimethylhydrogensiloxy groups, a methylhydrogensiloxane/diphenylsiloxane copolymer having both molecular terminals blocked with trimethylsiloxy groups, a methylhydrogensiloxane/diphenylsiloxane/dimethylsiloxane copolymer having both molecular terminals blocked with trimethylsiloxy groups, a trimethoxysilane polymer, a copolymer of $(CH_3)_2HSiO_{1/2}$ units and $SiO_{4/2}$ units, and a copolymer of $(CH_3)_2HSiO_{1/2}$ units, $SiO_{4/2}$ units, and $(C_6H_5)SiO_{3/2}$ units, but it is not limited thereto.

In addition, an organohydrogenpolysiloxane obtained by using the units represented by the following structures may also be used.

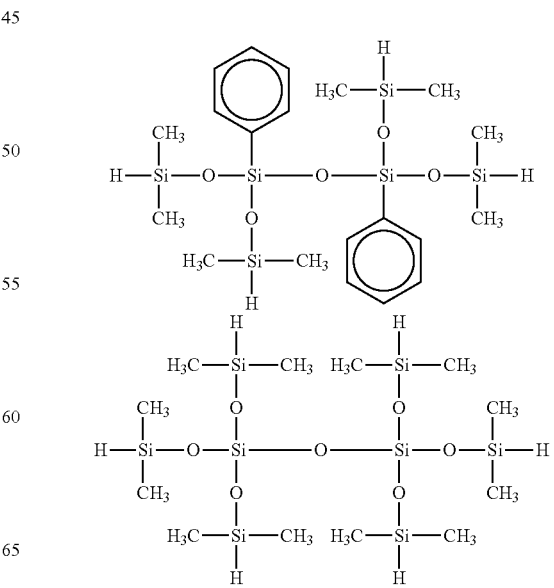

-continued

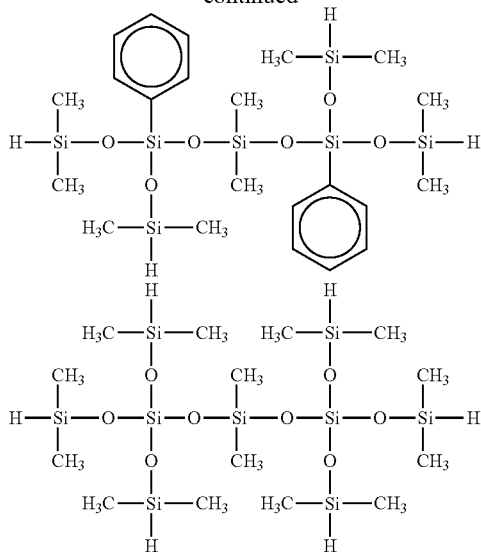

The molecular structure of the organohydrogenpolysiloxane, component (B), may be any of a linear, cyclic, branched, or three-dimensional network structure, and the number of silicon atoms in one molecule (or a polymerization degree in case of a polymer) is preferably 2 or more, more preferably 2 to 1,000, particularly preferably 2 to 300 approximately.

The organohydrogenpolysiloxane, component (B), is preferably contained such that the number of hydrogen atoms bonded to silicon atoms (SiH group) in component (B) is 0.7 to 3.0 per one group having a nonconjugated double bond, such as an alkenyl group, in component (A).

Component (C): Platinum-Based Catalyst

As to the component (C), a platinum-based catalyst is used. Examples of the platinum-based catalyst include a chloroplatinic acid, an alcohol-modified chloroplatinic acid, a platinum complex having a chelate structure. These may be used alone or in combination of two or more kinds.

The amount of the component (C) may be an effective amount for curing, or a so-called catalytic amount. A preferable amount thereof is generally 0.1 to 500 ppm in terms of a mass of the platinum group metal per a total amount of 100 parts by mass of the component (A) and the component (B), and the range of 0.5 to 100 ppm is particularly preferable.

Since the resin layer composed of a silicone resin becomes a resin layer for encapsulating semiconductor devices, the amount of halogen ions such as chlorine and alkali ions such as sodium, contained therein, is preferably reduced as possible. An exemplary method of reducing these ions is the same as in the epoxy resin; it is preferred that all the ions in the sample extracted at 120° C. be 10 ppm or less.

[Epoxy-Silicone Hybrid Resin]

Examples of the epoxy resin and the silicone resin used in the hybrid resin include the above-described epoxy resin and the above-described silicone resin.

Since the resin layer composed of the hybrid resin becomes a resin layer for encapsulating semiconductor devices, the amount of halogen ions such as chlorine and alkali ions such as sodium, contained therein, is preferably reduced as possible. An exemplary method of reducing these ions is the same as in the epoxy resin and silicone resin; it is desired that all the ions in the sample extracted at 120° C. be 10 ppm or less.

[Cyanate Ester Resin]

As to the cyanate ester resin, a resin composition containing the following components may be preferably used: (A') a cyanate ester compound and (B') a phenol compound and/or a dihydroxynaphthalene compound, with a content of 0.05 to 0.4 mol of the hydroxyl group in the component (B') per 1 mol of the cyanate group in the component (A'). Hereinafter, the components (A') and (B') will be described.

[Component (A')]

(Cyanate Ester Compound or Oligomer Thereof)

As the component (A') in the cyanate ester resin used in the present invention, the cyanate ester compound represented by the general formula (2) or an oligomer thereof can be preferably used,

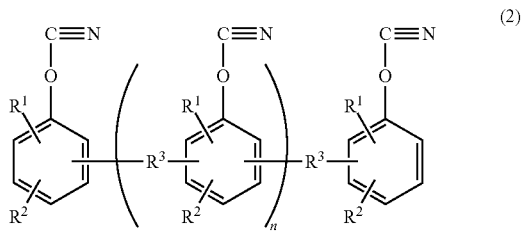

wherein $R^1$ and $R^2$ each represent a hydrogen atom or an alkyl group having 1 to 4 carbon atoms; $R^3$ is represented by any one of:

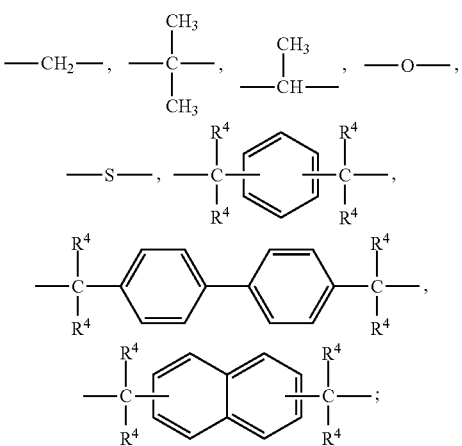

"n" is an integer of 0 to 30; and $R^4$ represents a hydrogen atom or a methyl group.

This cyanate ester compound is a compound having two or more cyanate groups per molecule, and illustrative examples thereof include a cyanic acid ester of a polycyclic aromatic divalent phenol such as bis(3,5-dimethyl-4-cyanatephenyl) methane, bis(4-cyanatephenyl)methane, bis(3-methyl-4-cyanatephenyl)-methane, bis(3-ethyl-4-cyanatephenyl)methane, bis(4-cyanatephenyl)-1,1-ethane, bis(4-cyanatephenyl)-2,2-propane, di(4-cyanatephenyl) ether, and di(4-cyanatephenyl)thioether; a polycyanic acid ester of a polyvalent phenol such as a phenol novolac type cyanate ester, a cresol novolac type cyanate ester, a phenylaralkyl type cyanate ester, a biphenylaralkyl type cyanate ester, and a naphthalenearalkyl type cyanate ester.

The above-described cyanate ester compound can be obtained by reaction between phenols and cyanogen chloride under basic conditions. The cyanate ester compound may be selected properly depending on the use from the wide range of materials with characteristics varied due to its structure from a solid state having a softening point of 106° C. to a liquid state at room temperature.

Among them, a cyanate ester compound having a small cyanate equivalent, i.e., a small amount of molecular weight between functional groups exhibits a slight curing shrinkage, enabling a cured product having low thermal expansion and high glass transition temperature to be obtained. Meanwhile a cyanate ester compound having a large cyanate equivalent exhibits a slightly reduced glass transition temperature but increases the flexibility of a triazine cross-linking distance, enabling reduction in elasticity, increase in toughness, and reduction in water absorbability to be expected.

Chlorine bonded to or remained in the cyanate ester compound is preferably 50 ppm or less, more preferably 20 ppm or less. It is preferably 50 ppm or less, because there is no possibility that chlorine or chlorine ions, liberated by thermal decomposition when being stored at a high temperature for a long period of time, corrode an oxidized Cu frame, Cu wire or Ag plating, thereby causing exfoliation or electric failure, and reduction in insulation property of the resin can be prevented.

[Component (B')]

The cyanate ester resin used in the present invention preferably contains component (B') as a curing agent. Generally, as a curing agent and a curing catalyst of a cyanate ester compound, a metal salt, a metal complex, or a phenolic hydroxyl group or a primary amine each having an active hydrogen is used. In the present invention, a phenol compound or a dihydroxynaphthalene compound is preferably used.

(Phenol Compound)

As the component (B'), a phenol compound having two or more hydroxyl groups per molecule, as represented by the general formula (3), can be preferably used,

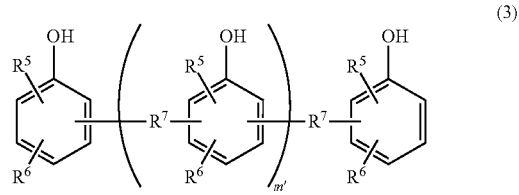

(3)

wherein $R^5$ and $R^6$ each represent a hydrogen atom or an alkyl group having 1 to 4 carbon atoms; $R^7$ is represented by any one of:

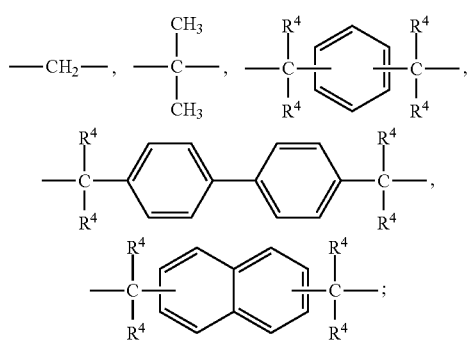

m' is an integer of 0 to 30; and $R^4$ represents a hydrogen atom or a methyl group.

Examples of the phenol compound include a phenol resin having two or more phenolic hydroxyl groups per molecule, a bisphenol F type resin, a bisphenol A type resin, a phenol novolac resin, a phenolaralkyl type resin, a biphenylaralkyl type resin, and a naphthalenearalkyl type resin; these may be used alone or in combination of two or more kinds.

Among the phenol compound, those having a small phenolic hydroxyl equivalent, for example, a hydroxyl equivalent of 120 or less, has high reactivity with a cyanate group, and therefore the curing reaction proceeds at a low temperature of 120° C. or lower. In this case, it is preferable to reduce the molar ratio of the hydroxyl group to the cyanate group. This ratio is preferably in the range of 0.05 to 0.11 mol per 1 mol of the cyanate group. In this case, a cured product exhibiting a slight curing shrinkage, a low thermal expansion, and high Tg can be obtained.

In contrast, a phenol compound having a large phenolic hydroxyl equivalent, for example, a hydroxyl equivalent of 175 or more, has an inhibited reactivity with a cyanate group, and therefore a composition having good preservability and good flowability can be obtained. The ratio is preferably in the range of 0.1 to 0.4 mol per 1 mol of the cyanate group. In this case, a cured product having low water absorption but a slightly reduced Tg can be obtained. These phenol resins may be used in combination of two or more kinds to obtain desired characteristics and curability of the cured product.

(Dihydroxynaphthalene Compound)

As the component (B'), a dihydroxynaphthalene compound represented by the formula (4), can also be preferably used.

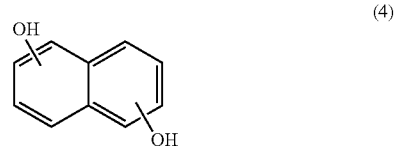

(4)

Examples of the dihydroxynaphthalene compound include 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 2,6-dihydroxynaphthalene, 2,7-dihydroxynaphthalene.

1,2-dihydroxynaphthalene, 1,3-dihydroxynaphthalene, and 1,6-dihydroxynaphthalene, each of which has a melting point of 130° C., have very high reactivity and promote cyclization reaction of the cyanate group with a small amount. 1,5-dihydroxynaphthalene and 2,6-dihydroxynaphthalene, each of which has a melting point of 200° C. or higher, relatively suppress the reaction.

Use of the dihydroxynaphthalene compound alone makes the molecular weight between functional groups small and the structure rigid, thereby enabling a cured product having a slight curing shrinkage and high Tg to be obtained. In addition, use of the dihydroxynaphthalene compound in combination with a phenol compound that has two or more hydroxyl groups per molecule and has a large hydroxyl equivalent enables the curability to be adjusted.

A halogen element and an alkali metal in the phenol compound and the dihydroxynaphthalene compound are preferably 10 ppm or less, particularly preferably 5 ppm or less when the sample is extracted at 120° C. under 2 atm.

The cyanate ester resin used in the present invention preferably contains either or both of the phenol compound and the dihydroxynaphthalene compound mentioned above as the component (B').

[Inorganic Filler]

An inorganic filler may be blended in the thermosetting resin constituting the resin layer. Examples of the inorganic filler to be blended include silica such as aerosol silica (fumed silica), precipitated silica, fused silica, and crystalline silica, alumina, silicon nitride, aluminum nitride, aluminosilicate, boron nitride, glass fiber, and antimonous trioxide. Average particle diameters or shapes of these inorganic fillers are not particularly limited.

In particular, as the inorganic filler to be added to the thermosetting resin composed of the epoxy resin, a filler previously subjected to surface treatment with a coupling agent such as a silane coupling agent, a titanate coupling agent, etc., may be blended to increase bond strength of the epoxy resin and the inorganic filler.

Preferable examples of the coupling agent include epoxy functional alkoxysilanes such as γ-glycidoxypropyltrimethoxysilane, γ-glycidoxypropylmethyldiethoxysilane, and β-(3,4-epoxycyclohexyl)ethyltrimethoxysilane; amino functional alkoxysilanes such as N-β-(aminoethyl)-γ-aminopropyltrimethoxysilane, γ-aminopropyltriethoxysilane, and N-phenyl-γ-aminopropyltrimethoxysilane; and mercapto functional alkoxysilanes such as γ-mercaptopropyltrimethoxysilane. Incidentally, the blending amount of the coupling agent to be used for the surface treatment and a method of the surface treatment are not particularly limited.

Similarly, when adding to the thermosetting resin composed of the silicone resin composition, a material obtained by treating a surface of the inorganic filler with the above-described coupling agent may be blended.

The blending amount of the inorganic filler is preferably 100 to 2000 parts by mass, particularly preferably 150 to 1000 parts by mass based on 100 parts by mass of the total mass of the thermosetting resin. If it is 100 parts by mass or more, sufficient strength can be obtained. If it is 2000 parts by mass or less, a reduction in flowability due to thickening can be suppressed and a failure in filling due to the reduction in flowability can also be suppressed, whereby the semiconductor devices formed on the wafer and the semiconductor devices arranged and mounted on the substrate can be excellently encapsulated.

<Support Base-Attached Encapsulant>

FIG. 1 shows an exemplary cross-sectional view of the support base-attached encapsulant of the present invention. The support base-attached encapsulant 10 of the present invention includes a support base 1 having a surface-treated fibrous film, which is a fibrous film subjected to surface treatment with an organosilicon compound, and a resin layer 2 composed of a thermosetting resin formed on one surface of the support base 1.

Such a support base-attached encapsulant can inhibit the substrate or the wafer from warping and the semiconductor devices from peeling away from the substrate, and can collectively encapsulate the semiconductor device mounting surface of the substrate having the semiconductor devices mounted thereon or the semiconductor device forming surface of the wafer having semiconductor devices formed thereon even when a large-diameter wafer or a large-area substrate such as inorganic, organic, or metal substrate is encapsulated. Also, it has uniformity and homogeneity without opening or tangle of fiber since the surface-treated fibrous film, which is thinner than the fiber-impregnated substrate, is used therein. Further, the support base-attached encapsulant is excellent in reliability such as heat resistance, electrical insulation property, and moisture resistance after encapsulating, and extremely excellent in versatility, mass-productivity, and economical efficiency since the organosilicon compound is used for the surface treatment.

[Method of Producing Support Base-Attached Encapsulant]

Exemplary methods of producing the support base-attached encapsulant of the present invention include a method in which an epoxy resin, a silicone resin, or the like that is a solid at room temperature is molded on one surface of a support base by compression under heating, or a method in which a suitable amount of a polar solvent such as acetone is added to an epoxy resin composition to liquefy the mixture, a thin film is formed by printing or dispensing, etc., and the solvent is removed by heating under reduced pressure to uniformly form a resin layer on one surface of a support base.

It is preferred that a surface of the support base (surface-treated fibrous film) be subjected to plasma treatment or corona treatment, and a resin layer composed of the thermosetting resin be then formed, since wetting property, bonding property, and adhesiveness between the support base and the resin layer are improved.

In either of the methods, a resin layer composed of an uncured thermosetting resin having a thickness of about 20 to 5000 μm and having no void and no volatile component can be formed on one surface of the support base.

[Substrate Having Semiconductor Devices Mounted Thereon and Wafer Having Semiconductor Devices Formed Thereon]

Figure 2A:
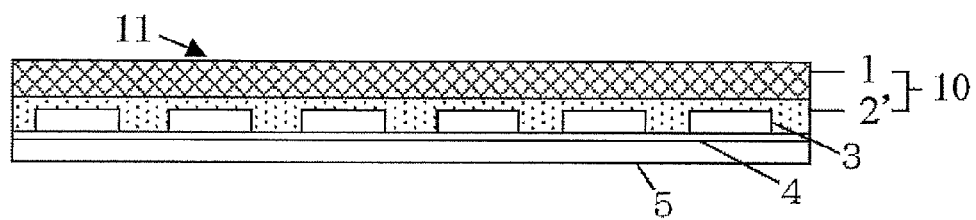
FIG. 2(a) shows an exemplary cross-sectional view of an encapsulated substrate having semiconductor devices mounted thereon that is obtained by being encapsulated with the support base-attached encapsulant of the present invention.
Figure 2B:
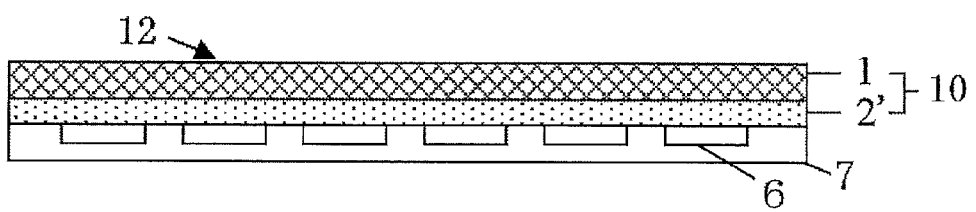
FIG. 2(b) shows an exemplary cross-sectional view of an encapsulated wafer having semiconductor devices formed thereon that is obtained by being encapsulated with the same.

The support base-attached encapsulant of the present invention serves to collectively encapsulate a semiconductor device mounting surface of a substrate having semiconductor devices mounted thereon or a semiconductor device forming surface of a wafer having semiconductor devices formed thereon. The substrate having the semiconductor devices mounted thereon may be exemplified by a substrate having a configuration that one or more semiconductor devices 3 are mounted on an inorganic, metal, or organic substrate 5 through an adhesive 4, as shown in FIG. 2(a). The wafer having the semiconductor devices formed thereon may be exemplified by a wafer having a configuration that semiconductor devices 6 are formed on a wafer 7, as shown in FIG. 2(b). It is to be noted that the substrate having semiconductor devices mounted thereon includes those using various kind of wafers such as silicon wafer, organic substrate, glass substrate, or metal substrate as the substrate 5, or semiconductor-devices-array on which semiconductor devices are mounted and aligned, for example.

<Encapsulated Substrate Having Semiconductor Devices Mounted Thereon and Encapsulated Wafer Having Semiconductor Devices Formed Thereon>

FIGS. 2(a) and 2(b) show exemplary cross-sectional views of an encapsulated substrate having semiconductor devices mounted thereon and an encapsulated wafer having semiconductor devices formed thereon that are obtained by being encapsulated with the support base-attached encapsulant of the present invention. In the encapsulated substrate having semiconductor devices mounted thereon 11 of the present invention, a semiconductor device mounting surface of a substrate 5 having semiconductor devices 3 mounted thereon is covered with the resin layer 2 (see FIG. 1) of the support base-attached encapsulant 10, the resin layer 2 (see FIG. 1) is heated and cured to provide a cured resin layer 2', and the surface is collectively encapsulated with the support base-attached encapsulant 10 (FIG. 2(a)). Furthermore, in the encapsulated wafer having semiconductor devices formed thereon 12 of the present invention, a semiconductor device forming surface of a wafer 7 having semiconductor devices 6 formed thereon is covered with the resin layer 2 (see FIG. 1) of the support base-attached encapsulant 10, the resin layer 2 (see FIG. 1) is heated and cured to provide the cured resin layer 2', and the surface is collectively encapsulated with the support base-attached encapsulant 10 (FIG. 2(b)).

As described above, in the encapsulated substrate having semiconductor devices mounted thereon and the encapsulated wafer having semiconductor devices formed thereon that are obtained by covering a semiconductor device mounting surface of a substrate having semiconductor devices mounted thereon or a semiconductor device forming surface of a wafer having semiconductor devices formed thereon with the resin layer of the support base-attached encapsulant, and heating and curing the thermosetting resin layer to collectively encapsulate the semiconductor device mounting surface or the a semiconductor device forming surface by the support base-attached encapsulant, occurrence of warp of the substrate or the wafer and peeling of the semiconductor devices from the substrate are inhibited.

<Semiconductor Apparatus>

Figure 3A:
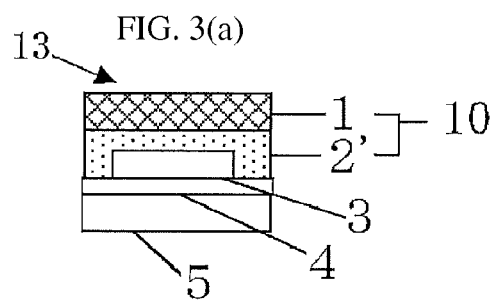
FIG. 3(a) shows an exemplary cross-sectional view of the semiconductor apparatus of the present invention manufactured from the encapsulated substrate having semiconductor devices mounted thereon.

FIGS. 3(a) and (b) show examples of the semiconductor apparatus of the present invention. the semiconductor apparatuses 13, 14 of the present invention is obtained by dicing the encapsulated substrate having semiconductor devices mounted thereon 11 (see FIG. 2) or the encapsulated wafer having semiconductor devices formed thereon 12 (see FIG. 2) into each piece. As described above, the semiconductor apparatus 13, 14 manufactured by dicing into each piece the encapsulated substrate having semiconductor devices mounted thereon 11 (see FIG. 2) or the encapsulated wafer having semiconductor devices formed thereon 12 (see FIG. 2), which has been encapsulated with the support base-attached encapsulant excellent in reliability such as heat resistance, electrical insulation property, light resistance, and moisture resistance and configured to inhibit warp of the substrate or the wafer and peeling of the semiconductor devices 3 from the substrate, is high quality. When the encapsulated substrate having semiconductor devices mounted thereon 11 (see FIG. 2(a)) is diced into each piece, the semiconductor apparatus 13 can be a semiconductor apparatus that has the semiconductor devices 3 mounted on the substrate 5 through the adhesive 4 and is encapsulated with the support base-attached encapsulant 10 composed of the cured resin layer 2' and the support base 1 from above (FIG. 3(a)). Furthermore, when the encapsulated wafer having semiconductor devices formed thereon 12 (see FIG. 2(b)) is diced into each piece, the semiconductor apparatus 14 can be a semiconductor apparatus that has the semiconductor devices 6 formed on the wafer 7 and is encapsulated with the support base-attached encapsulant 10 composed of the cured resin layer 2' and the support base 1 from above (FIG. 3(b)).

<Method for Manufacturing Semiconductor Apparatus>

In one aspect, the present invention encompasses the following method for manufacturing a semiconductor apparatus.

There is provided a method for manufacturing a semiconductor apparatus, comprising:

a covering step of covering a semiconductor device mounting surface of a substrate having semiconductor devices mounted thereon, or a semiconductor device forming surface of a wafer having semiconductor devices formed thereon with the resin layer of the above-described support base-attached encapsulant;

an encapsulating step of collectively encapsulating the semiconductor device mounting surface of the substrate or the semiconductor device forming surface of the wafer by heating and curing the resin layer to provide an encapsulated substrate having semiconductor devices mounted thereon or an encapsulated wafer having semiconductor devices formed thereon; and a piece forming step of dicing the encapsulated substrate having semiconductor devices mounted thereon or the encapsulated wafer having semiconductor devices formed thereon into each piece to manufacture a semiconductor apparatus.

Figure 4:
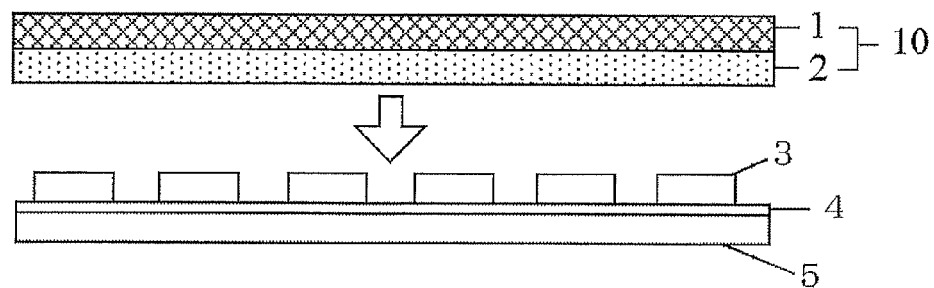
FIG. 4 shows an exemplary flowchart of the method for manufacturing a semiconductor apparatus from a substrate having semiconductor devices mounted thereon by using the support base-attached encapsulant of the present invention.
Figure 4:
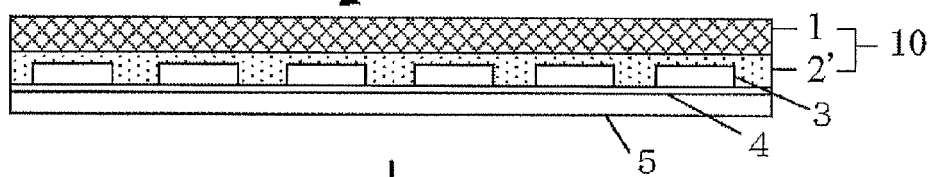
Figure 4:
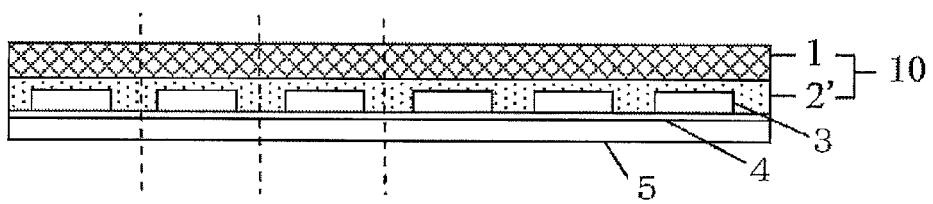
Figure 4:
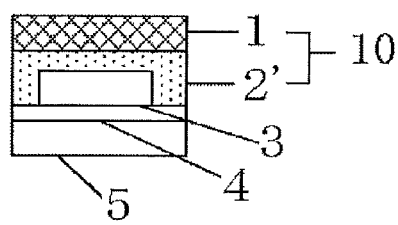

Hereinafter, the method for manufacturing a semiconductor apparatus of the present invention will be described with reference to FIG. 4.

[Covering Step]

The covering step according to the method for manufacturing a semiconductor apparatus of the present invention is a step of covering a semiconductor device mounting surface of a substrate 5 having semiconductor devices 3 mounted thereon through an adhesive 4 or a semiconductor device forming surface of a wafer (not shown) having semiconductor devices (not shown) formed thereon with the resin layer 2 of the support base-attached encapsulant 10 having the support base 1 and the resin layer 2 (FIG. 4(A)).

[Encapsulating Step]

The encapsulating step according to the method for manufacturing a semiconductor apparatus of the present invention is a step of heating and curing the resin layer 2 of the support base-attached encapsulant 10 to provide the cured resin layer 2' and thereby collectively encapsulating the semiconductor device mounting surface of the substrate 5 having semiconductor devices 3 mounted thereon or the semiconductor device forming surface of the wafer (not shown) having semiconductor devices (not shown) formed thereon to provide the encapsulated substrate having semiconductor devices mounted thereon 11 or the encapsulated wafer having semiconductor devices formed thereon (not shown) (FIG. 4(B)).

[Piece Forming Step]

Figure 3B:
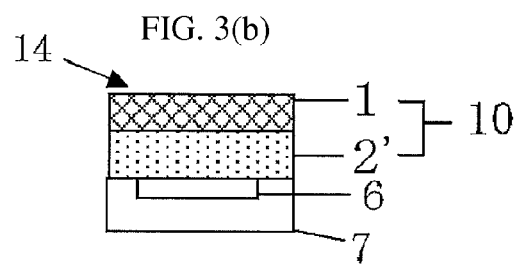
FIG. 3(b) shows an exemplary cross-sectional view of the semiconductor apparatus of the present invention manufactured from the encapsulated wafer having semiconductor devices formed thereon.

The piece forming step according to the method for manufacturing a semiconductor apparatus of the present invention is a step of dicing the encapsulated substrate having semiconductor devices mounted thereon 11 or the encapsulated wafer having semiconductor devices formed thereon (not shown) into each piece, thereby manufacturing the semiconductor apparatus 13 or 14 (see FIG. 3(b)) (FIGS. 4(C) and 4(D)).

Specific description will now be given hereinafter, but the present invention is not limited thereto. At the covering step and the encapsulating step, when a vacuum compression molding apparatus, a vacuum laminator apparatus, or the like is adopted, covering and encapsulating without void and warp can be carried out. As a method of lamination, any methods including roll lamination, diaphragm type vacuum lamination, air-pressure lamination, and others can be used. Among them, using both the vacuum lamination and the air-pressure method is preferable.

Here, description will be given as to an example of using the vacuum lamination apparatus manufactured by Nichigo-Morton Co., Ltd., to encapsulate a silicon wafer having a thickness of 100 μm and a diameter of 300 mm (12 inches) with a support base-attached encapsulant having a surface-treated glass fibrous film (support base) obtained by subjecting a glass cloth (fibrous base) having a thickness of 50 μm to surface treatment with methyltrimethoxysilane (KBM-13, available from Shin-Etsu Chemical Co., Ltd.) and further having a resin layer composed of a thermosetting silicone resin having a thickness of 50 μm and formed on one surface of the support base.

In upper and lower plates each having built-in heater and set at 150° C., the upper plate has a diaphragm rubber appressed against the heater under reduced pressure. A silicon wafer of 300 mm (12 inches) is set on the lower plate, and the support base-attached encapsulant is then placed on the silicon wafer so that the resin layer surface faces a semiconductor forming surface of the silicon wafer. Then, the lower plate is moved up, the upper and lower plates are closely attached to each other to define a vacuum chamber by an O-ring installed so as to surround the silicon wafer set on the lower plate, and a pressure inside the vacuum chamber is reduced. When the pressure inside the vacuum chamber is sufficiently reduced, a valve of a pipe connected to a vacuum pump from a space between the diaphragm rubber of the upper plate and the heater is closed to send compressed air. As a result, the upper diaphragm rubber inflates to sandwich the silicon wafer and the support base-attached encapsulant between the upper diaphragm rubber and the lower plate, and vacuum lamination and curing of the thermosetting silicone resin simultaneously advance to complete the encapsulation. A time of approximately 3 to 20 minutes is sufficient for curing. After the vacuum lamination is completed, the pressure inside the vacuum chamber is restored to normal pressure, the lower plate is moved down, and the encapsulated silicon wafer is taken out. The wafer can be encapsulated without void or warp by the above-described process. The taken-out silicon wafer is usually subjected to post cure at a temperature of 150 to 180° C. for 1 to 4 hours, thereby stabilizing electrical characteristics and mechanical characteristics.

The covering and encapsulating steps using the vacuum lamination apparatus are not restricted to the case that a glass fiber is used as the fibrous base and a silicone resin is used as the thermosetting resin as exemplified above, and they can also be used in other cases that carbon fiber or metal fiber is used as the fibrous base and an epoxy resin or a hybrid resin of epoxy and silicone is used as the thermosetting resin.

According to such a method for manufacturing a semiconductor apparatus, the semiconductor device mounting surface or the semiconductor device forming surface can be easily covered with the resin layer of the support base-attached encapsulant without a filling failure at the covering step. Further, since the support base-attached encapsulant is used, the support base can suppress shrinkage stress of the resin layer at the timing of curing, the semiconductor device mounting surface or the semiconductor device forming surface can be thereby collectively encapsulated at the encapsulating step, and the encapsulated substrate having semiconductor devices mounted thereon or the encapsulated wafer having semiconductor devices formed thereon, in which warp of the substrate or the wafer and peeling of the semiconductor devices from the substrate are inhibited, can be obtained even when a thin large-diameter wafer or a large-area substrate such as inorganic, organic, or metal substrate is collectively encapsulated. Furthermore, at the piece forming step, the encapsulated substrate having semiconductor devices mounted thereon or the encapsulated wafer having semiconductor devices formed thereon, which has been encapsulated with the support base-attached encapsulant excellent in reliability such as heat resistance and moisture resistance and is inhibited from warping, can be diced into each piece as a semiconductor apparatus, thereby providing the method for manufacturing a semiconductor apparatus that enables a high-quality semiconductor apparatus to be manufactured.

EXAMPLES

Hereinafter, the present invention will be described in more detail with reference to Preparation Examples, Examples, and Comparative Examples, but the present invention is not restricted to these examples.

Preparation Example 1

Preparation of Support Base-1

3-aminopropyltrimethoxysilane (Product name KBM-903, available from Shin-Etsu Chemical Co., Ltd.) was used as the organosilicon compound and impregnated into a glass cloth (Used yarn: D450, density: 53 warp yarns/25 mm, 53 weft yarns/25 mm, thickness: 42 μm, mass: 47 g/m$^2$), and the impregnated material was dried under heating at 100° C. for 10 minutes to perform surface treatment. Thereafter, the resultant material was subjected to heat treatment at 100° C. for 1 hour and 200° C. for 1 hour to prepare Support base-1.

The adhesion amount of the organosilicon compound in Support base-1 was 38.9% by mass.

Mechanical Characteristics
1. Conventional Bending Rigidity

The obtained support base was measured according to a procedure described in JIS R 3420 (Testing methods for textile glass products), and the ratio of conventional bending rigidity* was calculated by using the measured value in the warp direction.

*) The ratio of conventional bending rigidity=conventional bending rigidity of surface-treated glass fiber film/conventional bending rigidity of untreated glass fiber film 2. Linear Expansion Coefficient A sample having a width of 3 mm, a length of 25 mm, and a thickness of 50 to 300 μm was cut out from the obtained support base, and the sample was subjected to tensile test using a thermomechanical analysis (TMA) apparatus (Name of apparatus: TMA/SS6000, manufactured by Seiko Instruments Inc.) in the temperature range of from −60° C. to 200° C. with a temperature raising rate of 5° C./min. The linear expansion coefficient was measured from an elongation amount of the support base relative to the temperature.

3. Glass Transition Temperature

A sample having a width of 4 to 6 mm, a length of 30 to 40 mm, and a thickness of 50 to 300 μm was cut out from the obtained support base, and the glass transition temperature was measured according to a procedure described in JIS C 6481 using a dynamic viscoelasticity measuring apparatus (Name of apparatus: Q800, manufactured by TA Instruments Inc.) over the temperature range of from −100° C. to 300° C. in a parallel direction with the base (X-Y axial direction).

The results of the measurement mentioned above revealed that Support base-1 had a ratio of the conventional bending rigidity of 14.4 and a linear expansion coefficient of 9 ppm/° C., and the glass transition temperature was not detected.

Preparation Example 2

Preparation of Support Base-2

Support base-2 was prepared in the same manner as in Preparation Example 1 except for using a coating solution comprising 50 g of an amino group-containing organoalkoxysilane oligomer (X-40-2651, available from Shin-Etsu Chemical Co., Ltd.) and 50 g of toluene in place of 3-aminopropyltrimethoxysilane (Product name: KBM-903, available from Shin-Etsu Chemical Co., Ltd.) as the organosilicon compound.

The same evaluation as in Preparation Example 1 was carried out. The adhesion amount of the organosilicon compound was 56.5% by mass, the ratio of the conventional bending rigidity was 29.5, the linear expansion coefficient of 13 ppm/° C., and the glass transition temperature (° C.) was not detected.

Preparation Example 3

Preparation of Support Base-3

3-glycidoxypropyltrimethoxysilane (Product name: KBM-403, available from Shin-Etsu Chemical Co., Ltd.) was used as the organosilicon compound and impregnated into a glass cloth (Used yarn: E250, density: 59 warp yarns/25 mm, 57 weft yarns/25 mm, thickness: 87 mass: 95 g/m$^2$), and the impregnated material was dried under heating at 100° C. for 10 minutes to perform surface treatment. Thereafter, the resultant material was subjected to heat treatment at 100° C. for 1 hour and 200° C. for 1 hour to prepare Support base-3.

The same evaluation as in Preparation Example 1 was carried out. The adhesion amount of the organosilicon compound was 4.5% by mass, the ratio of the conventional bending rigidity was 6.3, the linear expansion coefficient of 8 ppm/° C., and the glass transition temperature (° C.) was not detected.

Preparation Example 4

Preparation of Support Base-4

To 100 parts by mass of water were added 0.5 part by mass of 3-glycidoxypropyltrimethoxysilane (Product name: KBM-403 available from Shin-Etsu Chemical Co., Ltd.), 0.02 part by mass of polyoxyethyleneoctylphenyl ether with HLB of 13.6 as a surfactant, and 0.05 part by mass of acetic acid to prepare a coating solution. By using the coating solution, the glass fiber used in Preparation Example 3 was subjected to surface treatment, and Support base-4 was prepared in the same manner.

The same evaluation as in Preparation Example 1 was carried out. The adhesion amount of the organosilicon compound was 0.05% by mass, the ratio of the conventional bending rigidity was 1.7, the linear expansion coefficient of 6 ppm/° C., and the glass transition temperature (° C.) was not detected.

Preparation Example 5

Preparation of Support Base-5

3-aminopropyltrimethoxysilane (Product name: KBM-903, available from Shin-Etsu Chemical Co., Ltd.) was used as the organosilicon compound and impregnated into a glass cloth (Used yarn: D450, density: 53 warp yarns/25 mm, 53 weft yarns/25 mm, thickness: 42 μm, mass: 47 g/m$^2$), and the impregnated material was dried under heating at 100° C. for 10 minutes. Thereafter, the resultant material was subjected to heat treatment at 100° C. for 1 hour and 200° C. for 1 hour to prepare Support base-5.

The same evaluation as in Preparation Example 1 was carried out. The adhesion amount of the organosilicon compound was 85.0% by mass, the ratio of the conventional bending rigidity was 95.5, the linear expansion coefficient of 18 ppm/° C., and the glass transition temperature (° C.) was not detected.

[Substrate Having Semiconductor Devices Mounted Thereon]

A BT (bismaleimide triazine) resin substrate having a thickness of 100 μm and a size of 240 mm×240 mm and a linear expansion coefficient of 10 ppm/° C. was prepared as an organic resin substrate. This substrate had a Cu wiring so as to be capable of mounting 168 chips having a size of 7.3 mm×7.3 mm (having a full area pad with a pad diameter of 100 μm and a pad pitch of 300 μm; a peripheral lead with a lead width of 20 μm and a lead pitch of 80 μm). On the Cu-wiring forming surface of the substrate was flip-chip bonded 168 silicon chips having a size of 7.3 mm×7.3 mm and a thickness of 100 μm that were arranged such that a 30-μm-height Cu pillar and a 15-μm SnAg could be connected with the wiring. The height of a gap defined between the chips and the substrate after the connection was about 48 μm.

Example 1

Preparation of Epoxy Resin Composition 60 parts by mass of a cresol novolac type epoxy resin, 30 parts by mass of a phenol novolac resin, 350 parts by mass of spherical silica having an average particle diameter of 0.6 μm in which 0.08% by mass of particles with a particle diameter of 10 μm or more is contained, 0.8 part by mass of a catalyst TPP (triphenylphosphine), and 0.5 part by mass of a silane coupling agent KBM403 (γ-glycidoxypropyltrimethoxysilane, available from Shin-Etsu Chemical Co., Ltd.) were sufficiently mixed by a high-speed mixing apparatus. The resultant mixture was heated and kneaded with a continuously kneading apparatus to form a sheet with a thickness of about 150 μm, and the sheet was then cooled.

—Manufacture of Support Base—Support base-1 was cut into a size of 230 mm×230 mm, and subjected to argon plasma treatment.

—Manufacture of Support Base-attached Encapsulant—

The sheet made of the epoxy resin composition was laminated on one surface of the support base, and a PET film subjected to a fluorine resin treatment (a release film) was laminated on the epoxy resin composition-laminated surface. The laminate was crimped at 50° C. to manufacture a support-base attached encapsulant (I-b) having the resin layer composed of the uncured epoxy resin composition with a thickness of 150 μm formed on one surface of Support base-1.

—Covering and Encapsulation of Substrate Having Semiconductor Devices Mounted Thereon—

The substrate having semiconductor devices mounted thereon was encapsulated with the manufactured support-base attached encapsulant (I-b) by using a vacuum laminating apparatus (manufactured by Nichigo-Morton Co., Ltd.). The temperature of the upper and lower plates was previously set at 150° C., the substrate having semiconductor devices mounted thereon was placed on the lower plate, and the support-base attached encapsulant (I-b) from which the release film has been removed was then placed thereon so that the epoxy resin composition layer constituting the resin layer of the support base-attached encapsulant (I-b) faced the semiconductor device mounting surface. Subsequently, the lower plate was raised to come into close contact with the upper plate so that the vacuum chamber was defined. After the pressure of the vacuum chamber was reduced to 50 Pa, the atmosphere between the upper plate and the diaphragm rubber was opened, and compressed air with a pressure of 0.5 MPa was applied for compression molding for 5 minutes. After molding, post-cure was performed at 180° C. for 4 hours to obtain an encapsulated substrate having semiconductor devices mounted thereon (I-c). The total thickness after the encapsulation was about 325 μm. The substrate was attached to a dicing tape to cut by dicing into individual pieces, so that a semiconductor apparatus with a size of 16 mm×16 mm was manufactured.

Example 2

A support base-attached encapsulant (II-b) was manufactured in the same manner as in Example 1 except for using Support base-2 manufactured in Preparation Example 2 in place of Support base-1 manufactured in Preparation Example 1. Then, an encapsulated substrate having semiconductor devices mounted thereon (II-c) was obtained.

Example 3

A support base-attached encapsulant (III-b) was manufactured in the same manner as in Example 1 except for using Support base-3 manufactured in Preparation Example 3 in place of Support base-1 manufactured in Preparation Example 1. Then, an encapsulated substrate having semiconductor devices mounted thereon (III-c) was obtained.

Example 4

Synthesis of Silicon Compound Having Nonconjugated Double Bond (A1)

27 mol of organosilane represented by $PhSiCl_3$, 1 mol of $ClMe_2SiO(Me_2SiO)_{33}SiMe_2Cl$, and 3 mol of $MeViSiCl_2$ were dissolved in a toluene solvent. The solvent was then added dropwise into water, co-hydrolyzed, washed with water, neutralized by alkali washing, dehydrated, and stripped to synthesize a silicon compound having a nonconjugated double bond (A1).

The composition ratio of constituent units in this compound is represented by the formula: $[PhSiO_{3/2}]_{0.27}[-SiMe_2O-(Me_2SiO)_{33}-SiMe_2O-]_{0.01}[MeViSiO_{2/2}]_{0.03}$. The weight average molecular weight of the compound was 62,000, and the melting point was 60° C. It is to be noted that Vi in the composition formula denotes a vinyl group represented by (—C═C).
—Synthesis of Organohydorgenpolysiloxane (B1)—

27 mol of organosilane represented by $PhSiCl_3$, 1 mol of $ClMe_2SiO(Me_2SiO)_{33}SiMe_2Cl$, and 3 mol of $MeHSiCl_2$ were dissolved in a toluene solvent. The solvent was then added dropwise into water, co-hydrolyzed, washed with water, neutralized by alkali washing, dehydrated, and stripped to synthesize organohydrogenpolysiloxane (B1).

The composition ratio of constituent units of this resin is represented by the formula: $[PhSiO_{3/2}]_{0.27}[-SiMe_2O-(Me_2SiO)_{33}-SiMe_2O-]_{0.01}[NeHSiO_{2/2}]_{0.03}$. The weight average molecular weight of the resin was 58,000, and the melting point was 58° C.
—Preparation of Composition for Forming Resin Layer composed of Uncured Silicone Resin Composition—

To a composition comprising 50 parts by mass of the silicon compound having a nonconjugated double bond (A1), 50 parts by mass of organohydrogenpolysiloxane (B1), 0.2 part by mass of acetylene alcohol-based ethynylcyclohexanol as a reaction inhibitor, and 0.1 part by mass of an octyl alcohol-modified solution of a chloroplatinic acid was added 350 parts by mass of spherical silica having an average particle diameter of 5 µm, and the mixture was well stirred with a planetary mixer heated at 60° C. to prepare a silicone resin composition (IV-a). This composition was a solid at room temperature (25° C.)
—Support Base—

Support base-1 manufactured in Preparation Example 1 was cut into a size of 230 mm×230 mm, and subjected to argon plasma treatment.
—Manufacture of Support Base-Attached Encapsulant—

The silicone resin composition (IV-b) was sandwiched between the treated Support base-1 (9 ppm/° C.) and a PET film coated with a fluorine resin (a release film), and compression molding was carried out using a hot press apparatus at 80° C. under a pressure of 5 t for 5 minutes to manufacture a support base-attached encapsulant (IV-b) having a resin layer composed of the uncured silicone resin composition with a thickness of 150 µm formed on one surface of Support base-1.
—Covering and Encapsulation of Substrate Having Semiconductor Devices Mounted Thereon—

The substrate having semiconductor devices mounted thereon was encapsulated with the support-base attached encapsulant (IV-b) in place of the support base-attached encapsulant (I-b) used in Example 1 by using a vacuum laminating apparatus (manufactured by Nichigo-Morton Co., Ltd.). At this time, the temperature of the upper and lower plates was set at 130° C. After molding, post-cure was performed at 150° C. for 2 hours to obtain an encapsulated substrate having semiconductor devices mounted thereon (IV-c). The total thickness after the encapsulation was about 325 µm. The substrate was attached to a dicing tape to cut by dicing into individual pieces, so that a semiconductor apparatus with a size of 16 mm×16 mm was manufactured.

Example 5

A support base-attached encapsulant (V-b) was manufactured in the same manner as in Example 1 except for using Support base-4 manufactured in Preparation Example 4 in place of Support base-1 manufactured in Preparation Example 1. Then, an encapsulated substrate having semiconductor devices mounted thereon (V-c) was obtained.

Example 6

A support base-attached encapsulant (IX-b) was manufactured in the same manner as in Example 1 except for using Support base-5 manufactured in Preparation Example 5 in place of Support base-1 manufactured in Preparation Example 1. Then, an encapsulated substrate having semiconductor devices mounted thereon (IX-c) was obtained.

Comparative Example 1

A glass epoxy resin substrate-attached encapsulant (VI-b) was manufactured in the same manner as in Example 1 except for using a glass epoxy resin substrate having a thickness of 60 µm in place of Support base-1 manufactured in Preparation Example 1. Then, an encapsulated substrate having semiconductor devices mounted thereon (VI-c) was obtained.

Comparative Example 2

Manufacture of Encapsulating Sheet

The epoxy resin composition prepared in Example 1 was mold into a sheet having a thickness of about 200 µm to manufacture an encapsulating sheet (VII-b) composed of the epoxy resin alone. After molding, the sheet was cut into a size of 230 mm×230 mm.
—Covering and Encapsulation of Substrate Having Semiconductor Devices Mounted Thereon—

The substrate having semiconductor devices mounted thereon was encapsulated with the encapsulating sheet (VII-b) manufactured as mentioned above by using a vacuum laminating apparatus (manufactured by Nichigo-Morton Co., Ltd.). At this time, the temperature of the upper and lower plates was set at 150° C. After molding, post-cure was performed at 180° C. for 4 hours to obtain an encapsulated substrate having semiconductor devices mounted thereon (VII-c). The total thickness after the encapsulation was about 325 µm. The substrate was attached to a dicing tape to cut by dicing into individual pieces, so that a semiconductor apparatus with a size of 16 mm×16 mm was manufactured.

Comparative Example 3

Manufacture of Encapsulating Sheet

The silicone resin composition (IV-a) prepared in Example 4 was sandwiched between a PET film (a pressurization base film) and a PET film coated with a fluorine resin (a release film), compression molding was carried out using a hot press apparatus at 80° C. under a pressure of 5 t for 5 minutes, and the composition was molded into a sheet having a thickness of 200 μm to manufacture an encapsulating sheet (VIII-b) composed of the silicone resin alone. After molding, the sheet was cut into a size of 230 mm×230 mm.

—Covering and Encapsulation of Substrate Having Semiconductor Devices Mounted Thereon—

The substrate having semiconductor devices mounted thereon was encapsulated with the encapsulating sheet (VIII-b) manufactured as mentioned above by using a vacuum laminating apparatus (manufactured by Nichigo-Morton Co., Ltd.). The temperature of the upper and lower plates was previously set at 130° C., the substrate having semiconductor devices mounted thereon was placed, and the encapsulating sheet (VIII-b) composed of the silicone resin composition (IV-a) alone from which the release film has been removed was then laminated thereon. Thereafter, the PET film (the pressurization base film) was also removed, then the plate was closed, and compression molding was carried out for 5 minutes to perform curing and encapsulating. After the curing and encapsulating, post-cure was performed at 150° C. for 2 hours to obtain an encapsulated substrate having semiconductor devices mounted thereon (VIII-c). The substrate was attached to a dicing tape to cut by dicing into individual pieces, so that a semiconductor apparatus with a size of 16 mm×16 mm was manufactured.

Warp, appearances, an adhesion state between the resin and the substrate, whether each semiconductor device has been peeled from the substrate were checked with respect to the encapsulated substrates having semiconductor devices mounted thereon (I-c) to (IX-c) obtained by encapsulating in Examples 1 to 6 and Comparative Examples 1 to 3 as described above. The results were shown in Table 1. Here, in regard to the appearance, presence of voids and unfilled portions were checked, and the appearance was determined to be good when these factors were not found. Moreover, the adhesion state was determined to be good when peeling did not occur at the time of molding.

Also, the encapsulated substrates having semiconductor devices mounted thereon in Examples 1 to 6 and Comparative Examples 1 to 3 were each diced into individual pieces, and the following heat resistance test and moisture resistance test were conducted. In the heat resistance test, a heat cycle test was performed with respect to a test piece (the test piece was maintained at −25° C. for 10 minutes, and then maintained at 125° C. for 10 minutes. This cycle was repeated 1000 times) to evaluate whether electrical conduction can be achieved after the test. Further, in the moisture resistance test, a direct-current voltage of 10 V was applied to both poles of a circuit of this test piece under conditions with a temperature of 85° C. and a relative humidity of 85% to evaluate whether a short circuit occurs, by using a migration tester (MIG-86, manufactured by IMV Corporation).

TABLE 1

| | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| Warp of Substrate (mm) | 0.3 | 0.5 | 0.5 | 0.9 | 1.5 | 1.3 | 5 | 8 | 15 |
| Appearance | good | good | good | good | good | good | good | good | good |
| Appearance/Void | none | none | none | none | none | none | none | none | none |
| Appearance/Unfilled | none | none | none | none | none | none | none | none | none |
| Adhesion State | good | good | good | good | good | good | good | good | good |
| Peeling from Substrate | none | none | none | none | none | none | none | partial peeling | partial peeling |
| Heat Resistance Test | no problem | no problem | no problem | no problem | no problem | no problem | no problem | short circuit | short circuit |
| Moisture Resistance Test | no problem | no problem | no problem | no problem | no problem | no problem | no problem | no problem | short circuit |

As shown in Table 1, Comparative Examples 1 to 3 demonstrated that when the semiconductor device mounting surface of the substrate having semiconductor devices mounted thereon was collectively encapsulated without the surface-treated fibrous film, the encapsulated substrate having semiconductor devices mounted thereon to be manufactured greatly warped as compared with Examples. Moreover, in Comparative Examples 2 and 3, it was revealed that the semiconductor devices were peeled from the substrate since the warp was too large. On the other hand, Examples 1 to 6, in which the support base-attached encapsulant of the present invention was used, demonstrated that warp of the substrate was greatly inhibited, appearance and adhesion state were excellent, and neither voids nor unfilled portions were generated. Further, the results of the reliability evaluation of the semiconductor apparatus obtained by dicing into each piece revealed that Examples 1 to 6 have no difference, and all of them have excellent heat resistance and moisture resistance.

As described above, it was revealed that the support base-attached encapsulant according to the present invention can suppress the shrinkage stress at the time of curing the resin layer, whereby warp of the substrate and peeling of the semiconductor devices from the substrate are inhibited, and a high-quality semiconductor apparatus can be obtained.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A support base-attached encapsulant for collectively encapsulating a semiconductor device mounting surface of a substrate having semiconductor devices mounted thereon or a semiconductor device forming surface of a wafer having semiconductor devices formed thereon, comprising
   a support base having one fibrous film or a plurality of the fibrous films being laminated, the fibrous film being subjected to surface treatment with an organosilicon compound, and
   a resin layer composed of a thermosetting resin formed on one surface of the support base.

2. The support base-attached encapsulant according to claim 1, wherein the fibrous film subjected to the surface treatment has a conventional bending rigidity 3 to 100 times larger than a conventional bending rigidity of an untreated fibrous film as measured according to a procedure described in Japanese Industrial Standards R 3420.

3. The support base-attached encapsulant according to claim 1, wherein an amount of the organosilicon compound used for the surface treatment is 2% by mass or more and 90% by mass or less based on 100% by mass of the fibrous film subjected to the surface treatment, and a part or all of fiber bundles constituting the fibrous film are bound by the surface treatment.

4. The support base-attached encapsulant according to claim 2, wherein an amount of the organosilicon compound used for the surface treatment is 2% by mass or more and 90% by mass or less based on 100% by mass of the fibrous film subjected to the surface treatment, and a part or all of fiber bundles constituting the fibrous film are bound by the surface treatment.

5. The support base-attached encapsulant according to claim 1, wherein the organosilicon compound is one or more compounds selected from the group consisting of alkoxysilane, polysilazane, partial hydrolysis condensates thereof, and a silicone-modified varnish.

6. The support base-attached encapsulant according to claim 2, wherein the organosilicon compound is one or more compounds selected from the group consisting of alkoxysilane, polysilazane, partial hydrolysis condensates thereof, and a silicone-modified varnish.

7. The support base-attached encapsulant according to claim 3, wherein the organosilicon compound is one or more compounds selected from the group consisting of alkoxysilane, polysilazane, partial hydrolysis condensates thereof, and a silicone-modified varnish.

8. The support base-attached encapsulant according to claim 4, wherein the organosilicon compound is one or more compounds selected from the group consisting of alkoxysilane, polysilazane, partial hydrolysis condensates thereof, and a silicone-modified varnish.

9. The support base-attached encapsulant according to claim 1, wherein the fibrous film subjected to the surface treatment does not have a glass transition temperature of 250° C. or less as measured according to a procedure described in Japanese Industrial Standards C 6481.

10. The support base-attached encapsulant according to claim 2, wherein the fibrous film subjected to the surface treatment does not have a glass transition temperature of 250° C. or less as measured according to a procedure described in Japanese Industrial Standards C 6481.

11. The support base-attached encapsulant according to claim 1, wherein a surface of the support base is subjected to plasma treatment or corona treatment.

12. The support base-attached encapsulant according to claim 2, wherein a surface of the support base is subjected to plasma treatment or corona treatment.

13. The support base-attached encapsulant according to claim 1, wherein the thermosetting resin is a resin selected from the group consisting of an epoxy resin, a silicone resin, a cyanate ester resin, and a hybrid resin thereof, and the resin layer is uncured.

14. The support base-attached encapsulant according to claim 2, wherein the thermosetting resin is a resin selected from the group consisting of an epoxy resin, a silicone resin, a cyanate ester resin, and a hybrid resin thereof, and the resin layer is uncured.

15. An encapsulated substrate having semiconductor devices mounted thereon, obtained by covering a semiconductor device mounting surface of a substrate having semiconductor devices mounted thereon with the resin layer of the support base-attached encapsulant according to claim 1, and heating and curing the resin layer to collectively encapsulate the semiconductor device mounting surface by the support base-attached encapsulant.

16. An encapsulated wafer having semiconductor devices formed thereon, obtained by covering a semiconductor device forming surface of a wafer having semiconductor devices formed thereon with the resin layer of the support base-attached encapsulant according to claim 1, and heating and curing the resin layer to collectively encapsulate the semiconductor device forming surface by the support base-attached encapsulant.

17. A semiconductor apparatus obtained by dicing the encapsulated substrate having semiconductor devices mounted thereon according to claim 15 into each piece.

18. A semiconductor apparatus obtained by dicing the encapsulated wafer having semiconductor devices formed thereon according to claim 16 into each piece.

19. A method for manufacturing a semiconductor apparatus, comprising:
   a covering step of covering a semiconductor device mounting surface of a substrate having semiconductor devices mounted thereon, or a semiconductor device forming surface of a wafer having semiconductor devices formed thereon with the resin layer of the support base-attached encapsulant according to claim 1;
   an encapsulating step of collectively encapsulating the semiconductor device mounting surface of the substrate or the semiconductor device forming surface of the wafer by heating and curing the resin layer to provide an encapsulated substrate having semiconductor devices mounted thereon or an encapsulated wafer having semiconductor devices formed thereon; and
   a piece forming step of dicing the encapsulated substrate having semiconductor devices mounted thereon or the encapsulated wafer having semiconductor devices formed thereon into each piece to manufacture a semiconductor apparatus.

20. A method for manufacturing a semiconductor apparatus, comprising:
   a covering step of covering a semiconductor device mounting surface of a substrate having semiconductor devices mounted thereon, or a semiconductor device forming surface of a wafer having semiconductor devices formed thereon with the resin layer of the support base-attached encapsulant according to claim 2;

an encapsulating step of collectively encapsulating the semiconductor device mounting surface of the substrate or the semiconductor device forming surface of the wafer by heating and curing the resin layer to provide an encapsulated substrate having semiconductor devices mounted thereon or an encapsulated wafer having semiconductor devices formed thereon; and a piece forming step of dicing the encapsulated substrate having semiconductor devices mounted thereon or the encapsulated wafer having semiconductor devices formed thereon into each piece to manufacture a semiconductor apparatus.

* * * * *